(12) United States Patent
Miyazaki et al.

(10) Patent No.: US 9,219,066 B2
(45) Date of Patent: Dec. 22, 2015

(54) METHOD OF MANUFACTURING SEMICONDUCTOR STORAGE DEVICE AND SEMICONDUCTOR STORAGE DEVICE

(71) Applicant: KABUSHIKI KAISHA TOSHIBA, Tokyo (JP)

(72) Inventors: Shoichi Miyazaki, Yokkaichi (JP); Koichi Matsuno, Mie-gun (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 288 days.

(21) Appl. No.: 13/847,107

(22) Filed: Mar. 19, 2013

(65) Prior Publication Data
US 2013/0248971 A1 Sep. 26, 2013

(30) Foreign Application Priority Data
Mar. 23, 2012 (JP) .................................. 2012-067401

(51) Int. Cl.
| H01L 21/02 | (2006.01) |
|---|---|
| H01L 21/70 | (2006.01) |
| H01L 21/20 | (2006.01) |
| H01L 27/105 | (2006.01) |
| H01L 27/115 | (2006.01) |
| H01L 21/764 | (2006.01) |
| H01L 21/768 | (2006.01) |

(52) U.S. Cl.
CPC .......... H01L 27/1052 (2013.01); H01L 21/764 (2013.01); H01L 21/7682 (2013.01); H01L 21/76837 (2013.01); H01L 27/11524 (2013.01)

(58) Field of Classification Search
USPC ................ 257/315, 316, 347, E29.17, E29.3
See application file for complete search history.

(56) References Cited

U.S. PATENT DOCUMENTS

| 7,019,364 B1 | 3/2006 | Sato et al. | |
|---|---|---|---|
| 7,884,415 B2 | 2/2011 | Nagano | |
| 8,519,468 B2* | 8/2013 | Toba | H01L 21/76897 257/316 |
| 8,546,239 B2* | 10/2013 | Harari | H01L 21/764 257/321 |
| 8,546,909 B2* | 10/2013 | Noda | H01L 21/28273 257/316 |
| 2005/0047261 A1* | 3/2005 | Kai et al. | 365/232 |
| 2006/0194390 A1 | 8/2006 | Imai et al. | |

(Continued)

FOREIGN PATENT DOCUMENTS

| JP | 2006-228893 A | 8/2006 |
|---|---|---|
| JP | 2007-180570 A | 7/2007 |

(Continued)

*Primary Examiner* — Mary Wilczewski
*Assistant Examiner* — Tsz Chiu
(74) *Attorney, Agent, or Firm* — Oblon, McClelland, Maier & Neustadt, L.L.P.

(57) ABSTRACT

Method of manufacturing a semiconductor device includes forming, in a first region, a first trench through a second gate electrode film and an interelectrode insulating film, and a second trench partially extending into a sacrificial film in an isolation trench, filling the second trench with a first insulating film; forming a third gate electrode film above the second gate electrode film and into the first trench such that the third gate electrode film contacts the first gate electrode film; etching the third and the second gate electrode film, the interelectrode insulating film, and the first gate electrode film to form select gate electrodes in the first region and a group of memory-cell gate electrodes in the second region; removing the sacrificial film; and forming a second insulating film over the element regions and the isolation trench to define an unfilled gap in the isolation trench below the memory-cell gate electrodes.

7 Claims, 45 Drawing Sheets

(56) References Cited

U.S. PATENT DOCUMENTS

| | | |
|---|---|---|
| 2007/0257305 A1 | 11/2007 | Sasago et al. |
| 2009/0101960 A1* | 4/2009 | Aoki et al. .................. 257/315 |
| 2010/0230741 A1* | 9/2010 | Choi et al. .................. 257/324 |
| 2013/0248970 A1* | 9/2013 | Kai et al. .................... 257/319 |

FOREIGN PATENT DOCUMENTS

| | | |
|---|---|---|
| JP | 2007-299975 A | 11/2007 |
| JP | 4074051 B2 | 4/2008 |
| JP | 2009-302116 A | 12/2009 |
| JP | 2010-040753 A | 2/2010 |

* cited by examiner

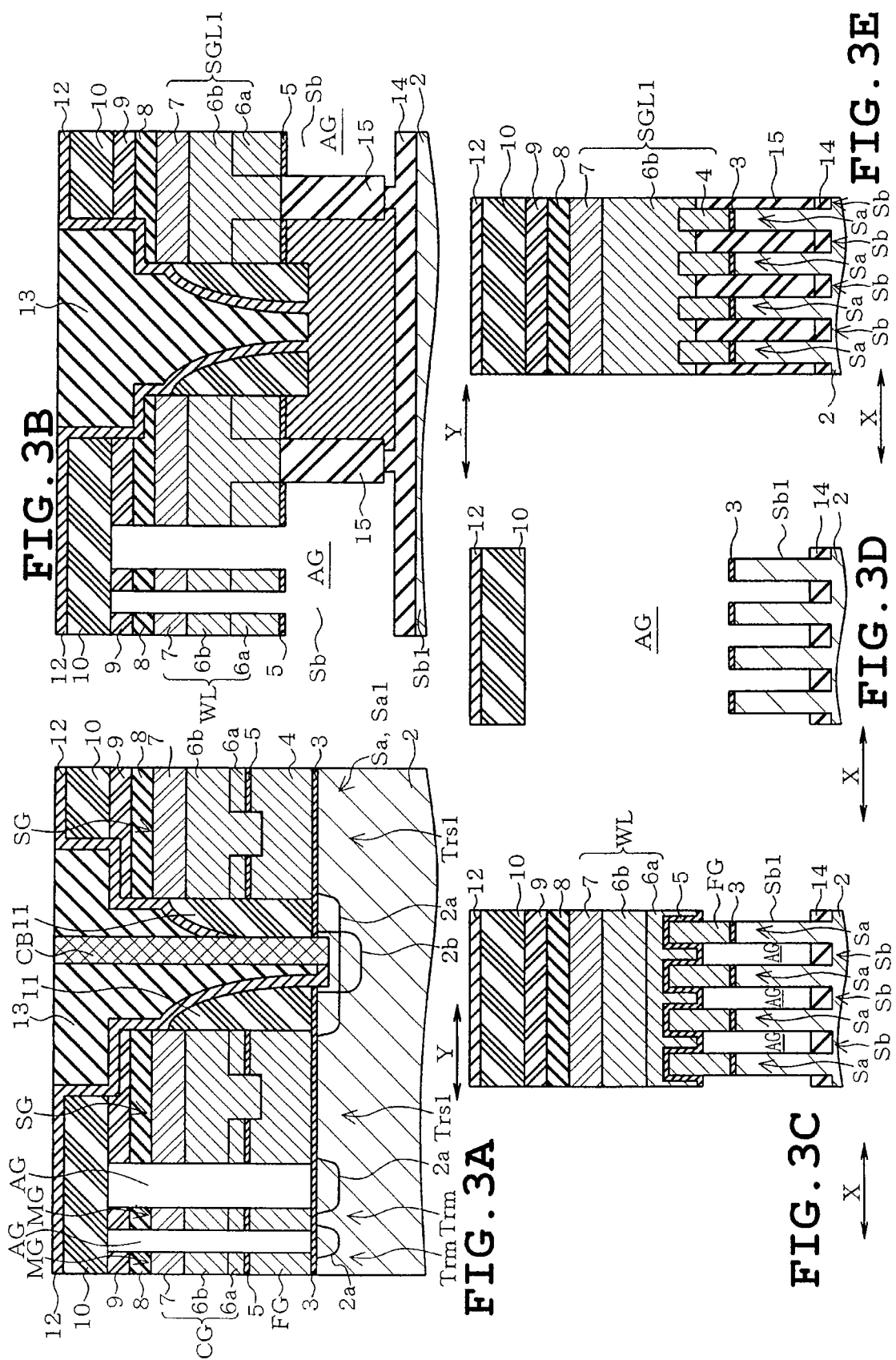

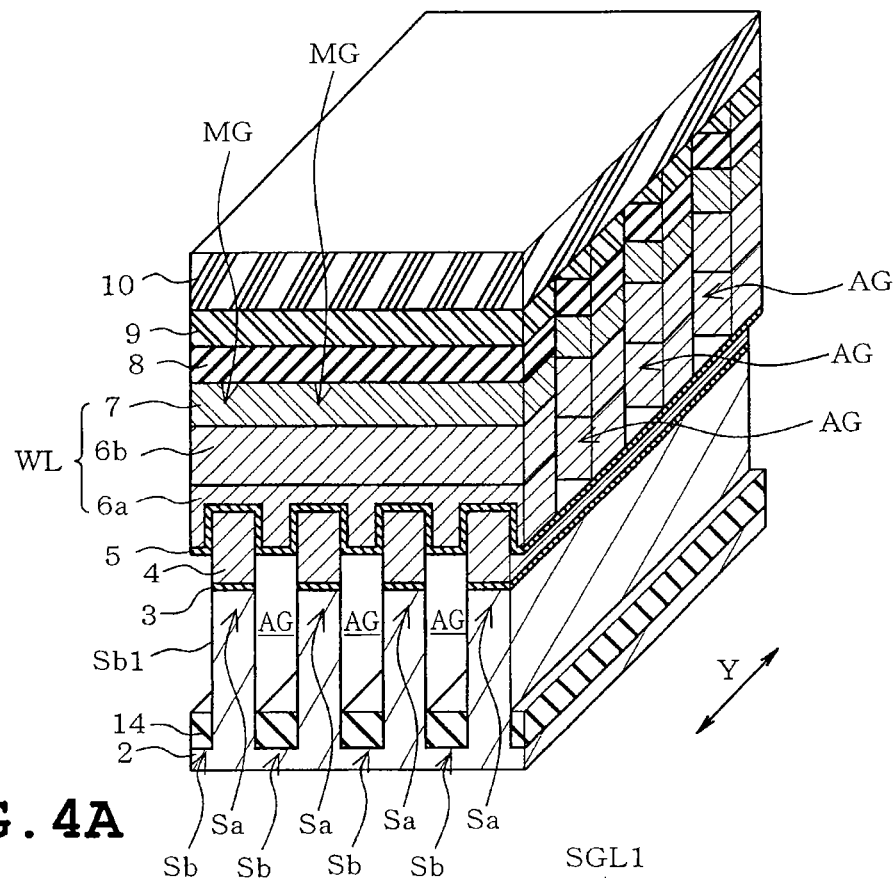
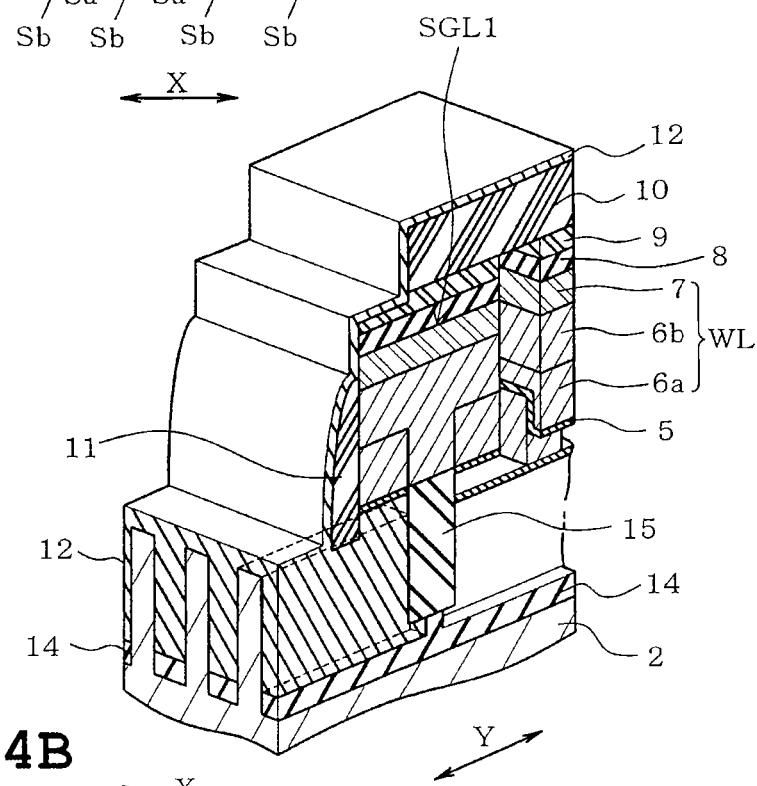
FIG. 4A
FIG. 4B

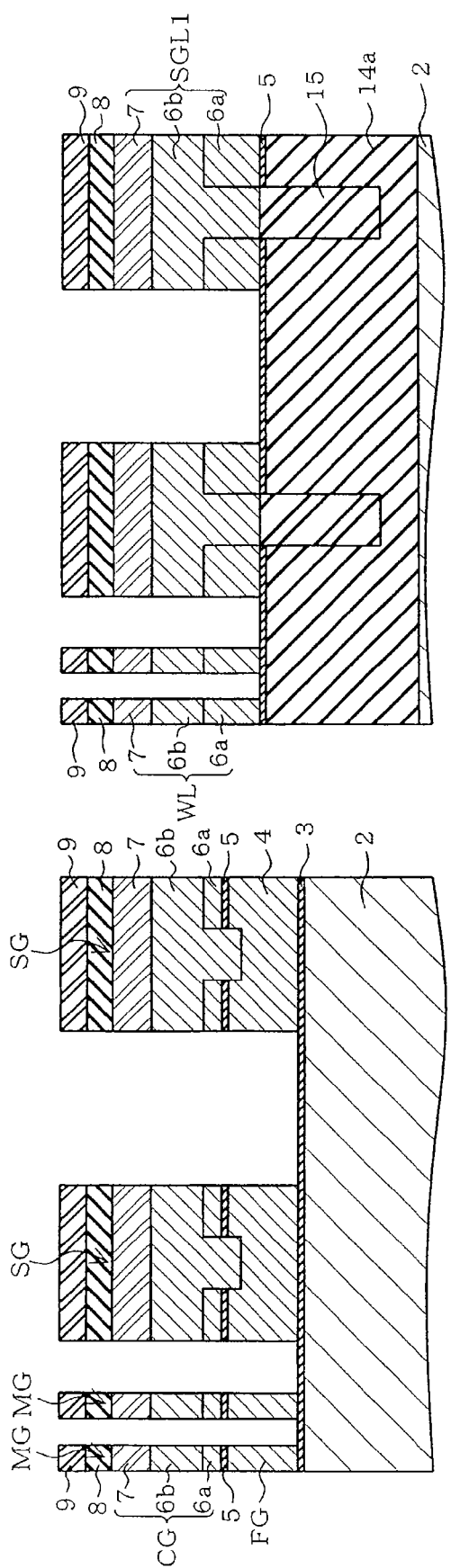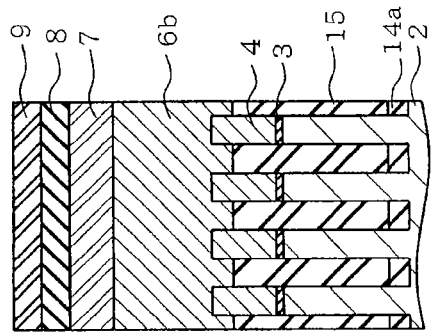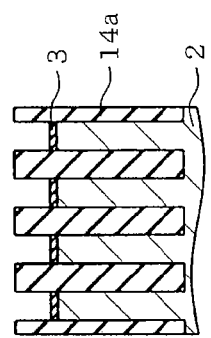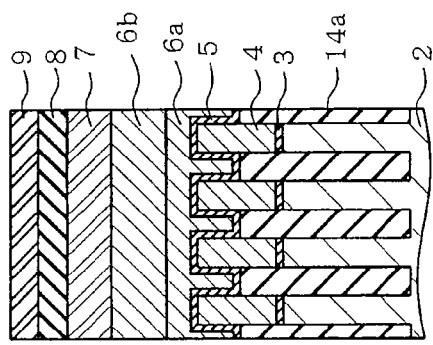

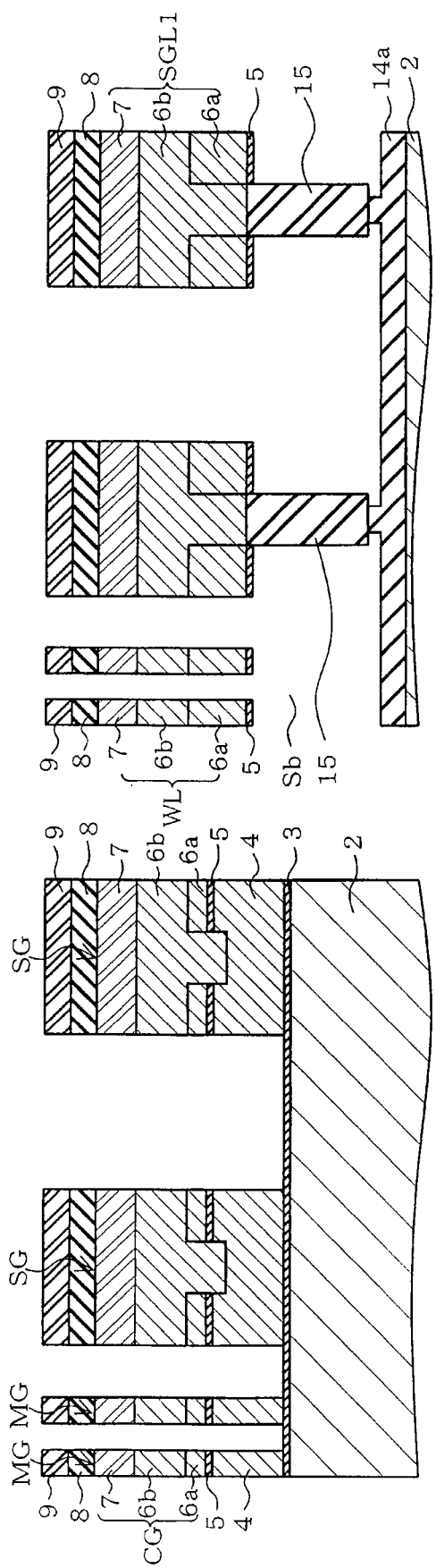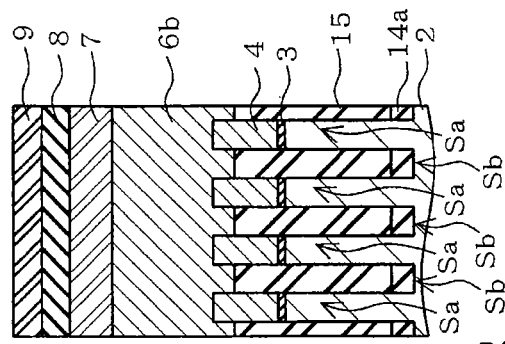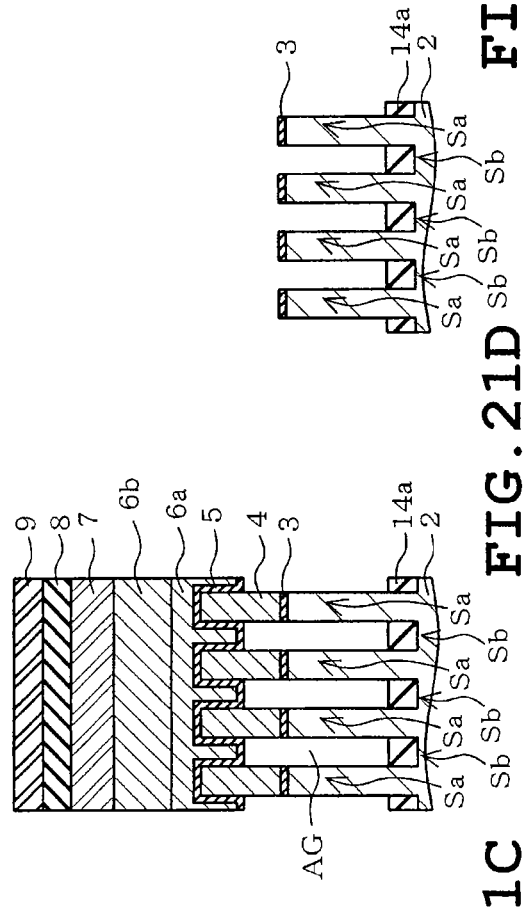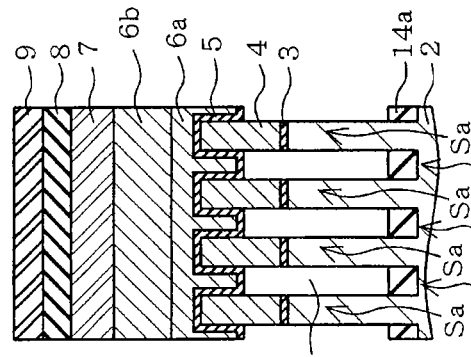

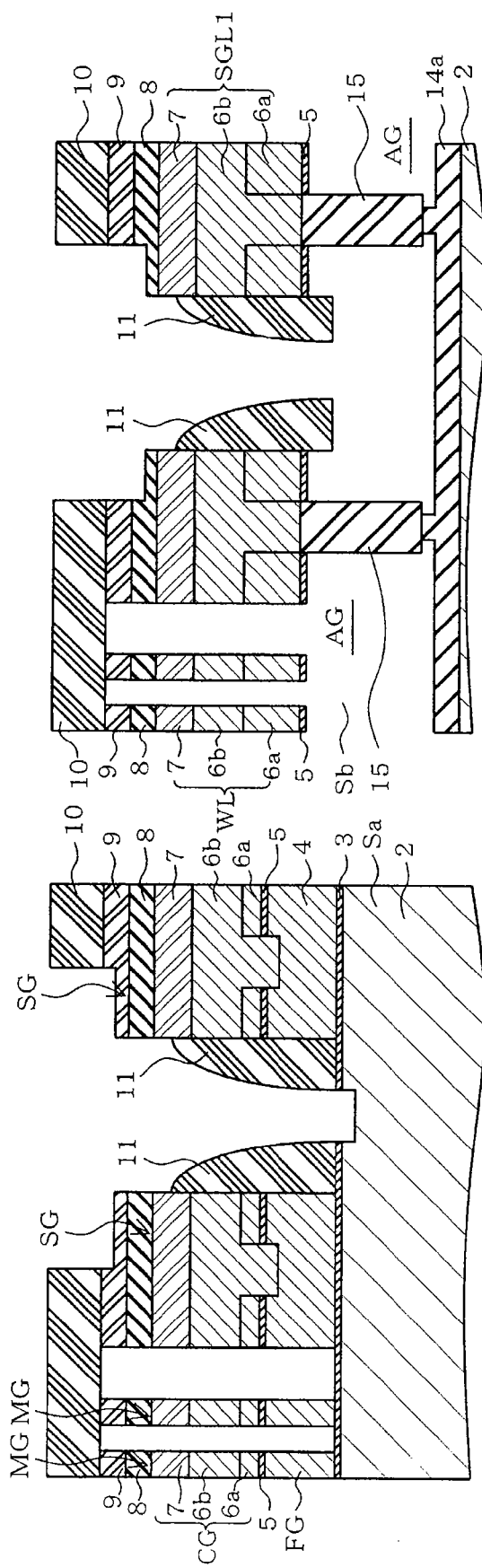
FIG. 23A
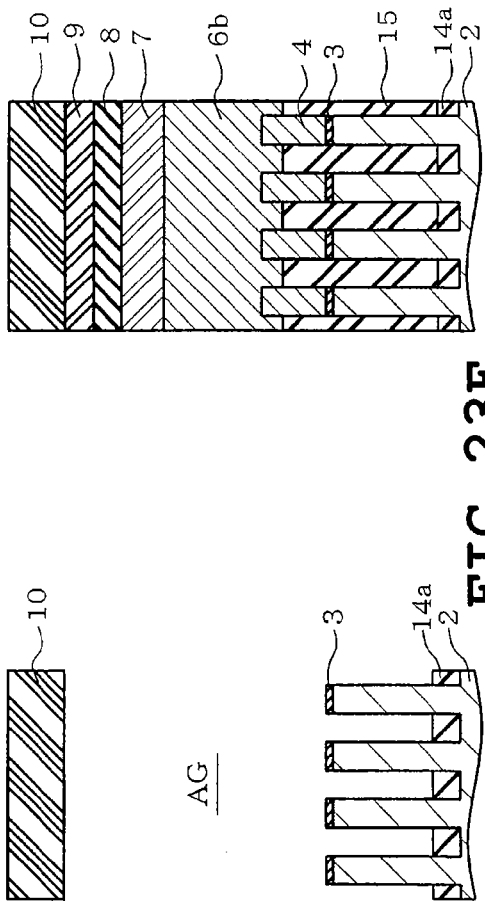
FIG. 23B
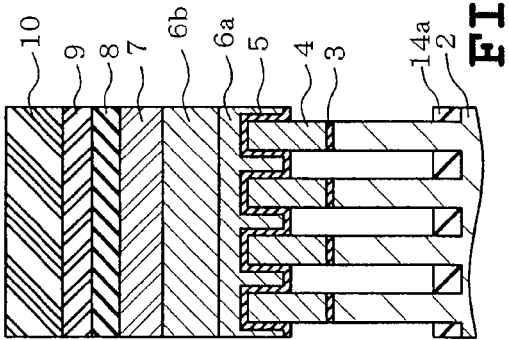
FIG. 23E
FIG. 23C
FIG. 23D

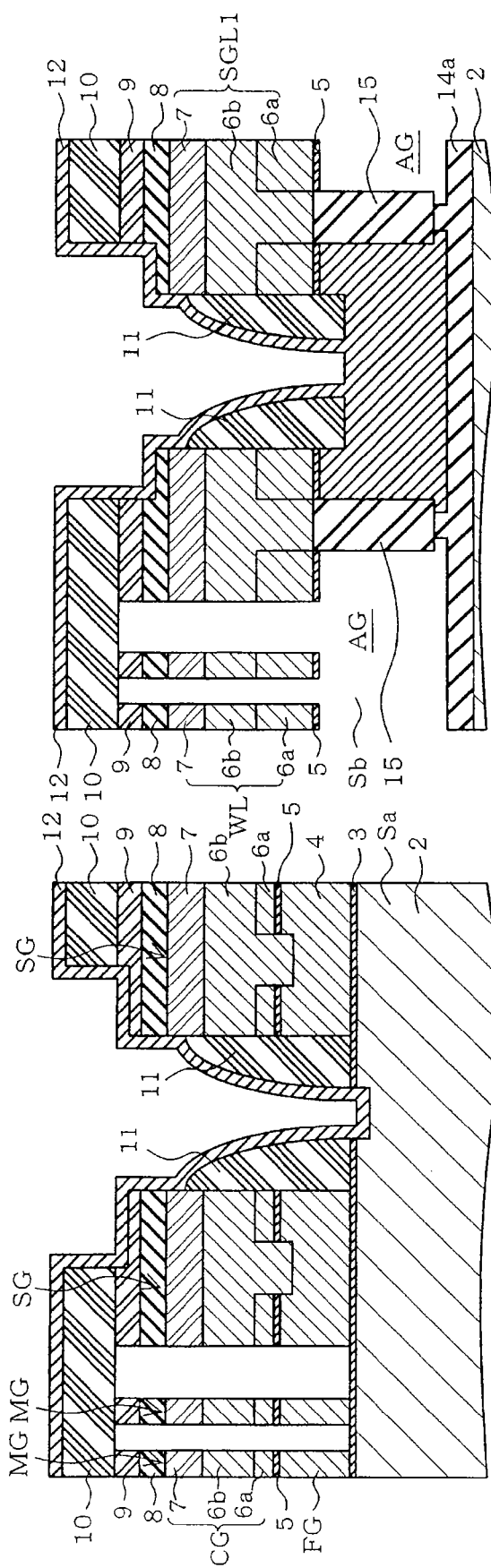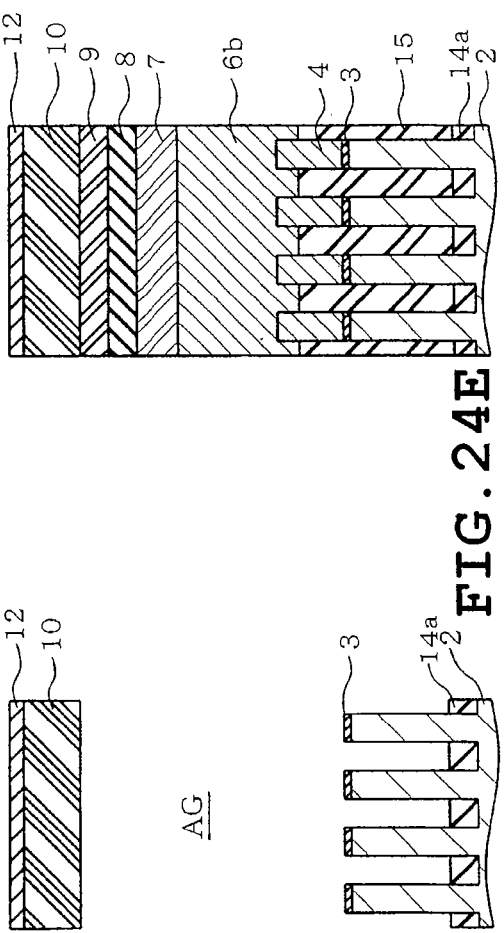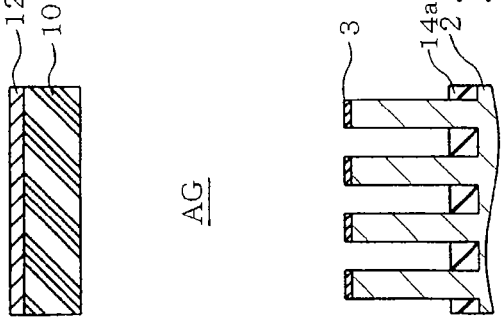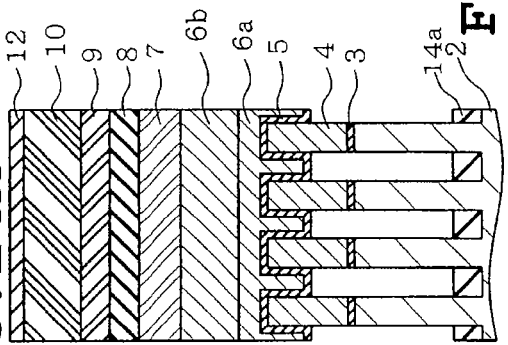

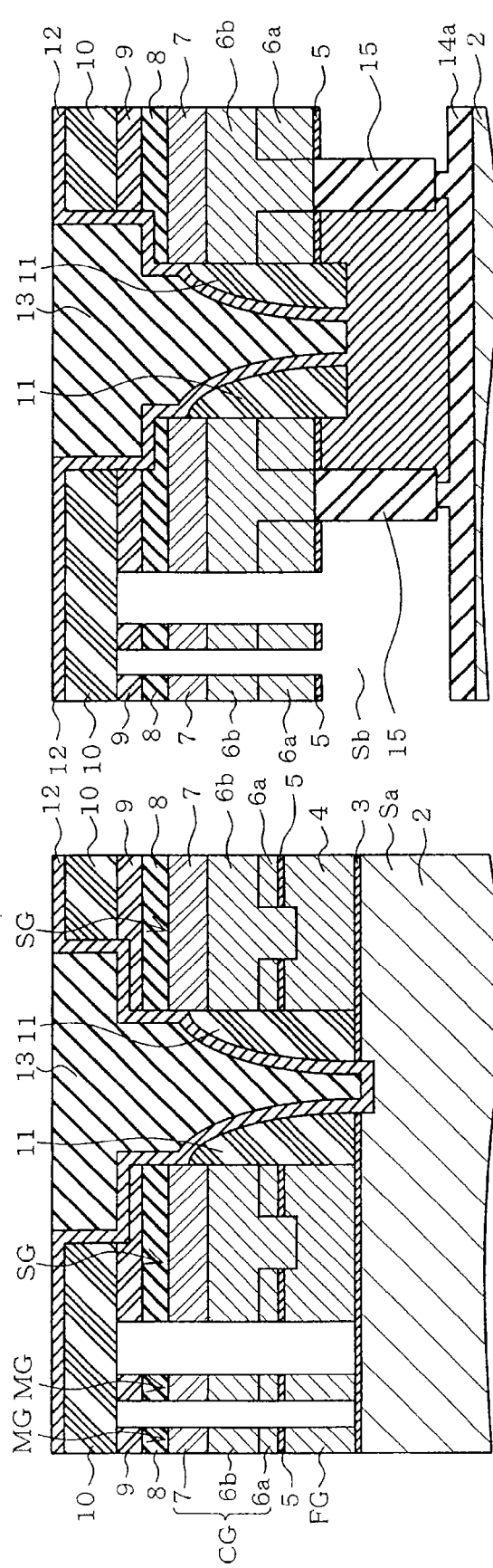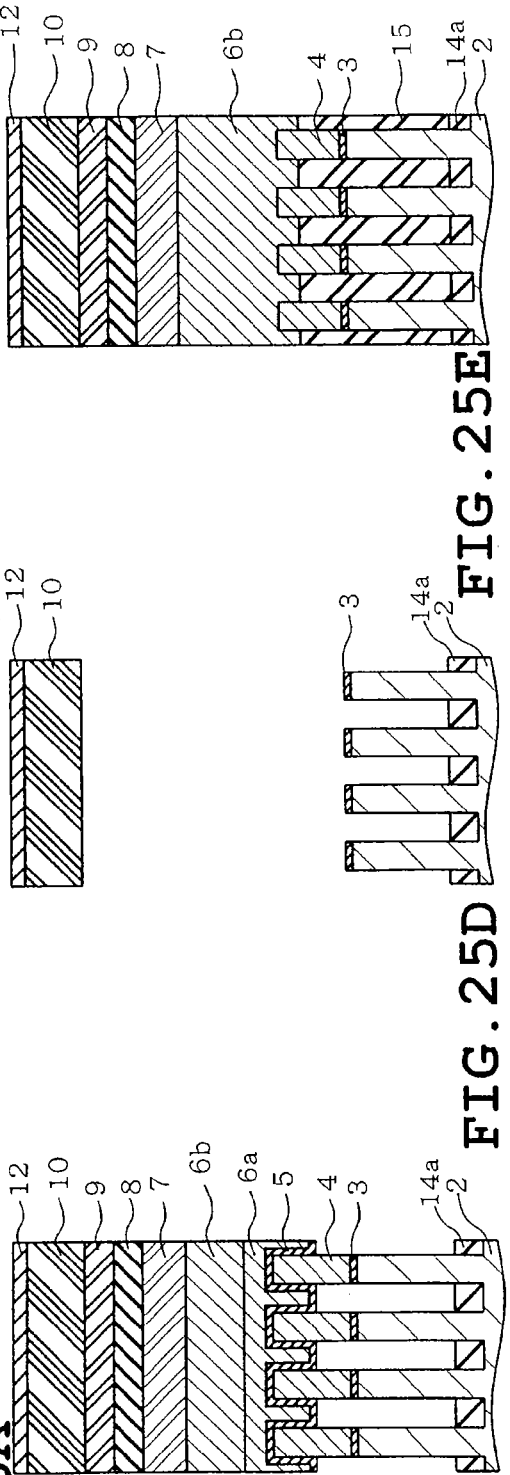
FIG. 25A
FIG. 25B
FIG. 25C
FIG. 25D
FIG. 25E

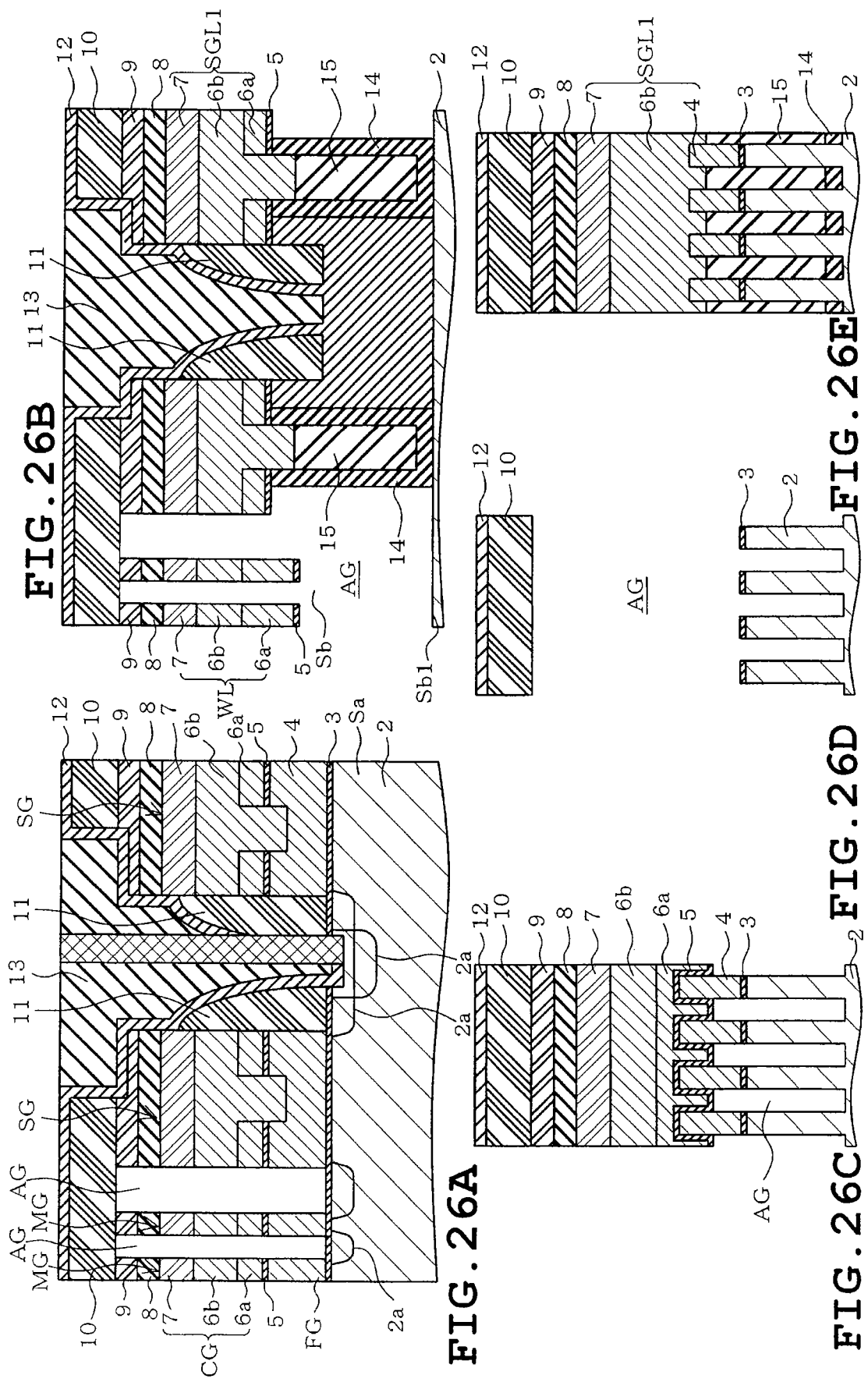

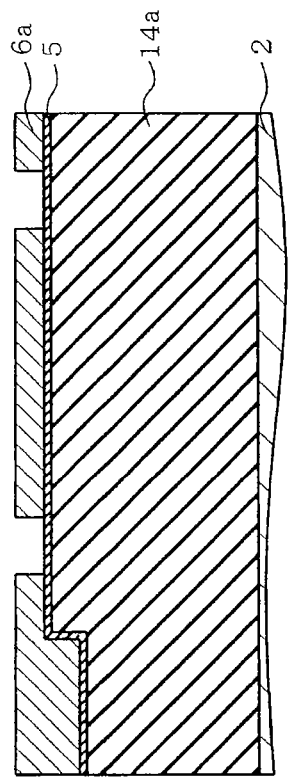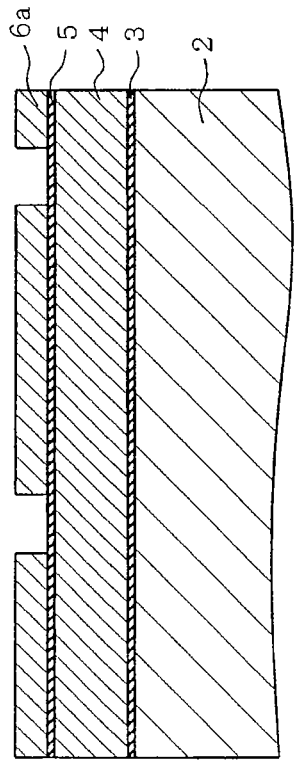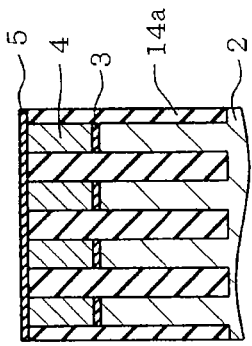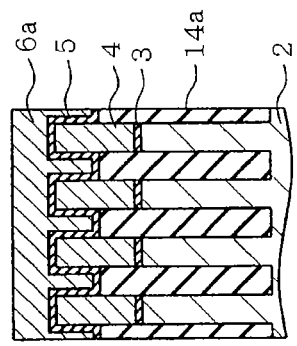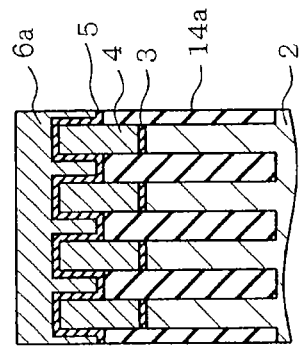

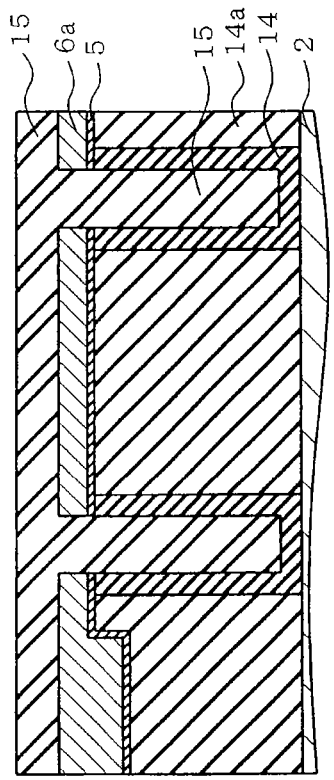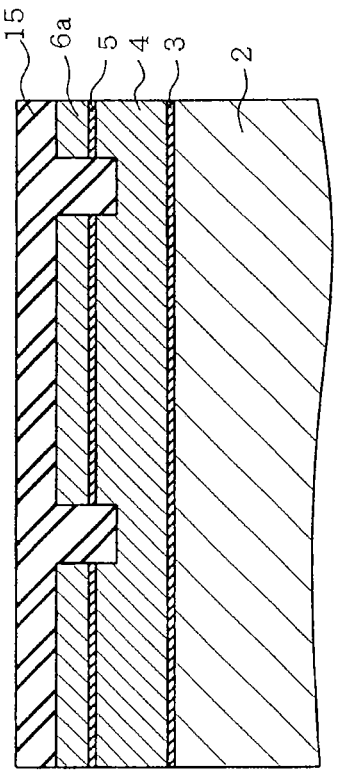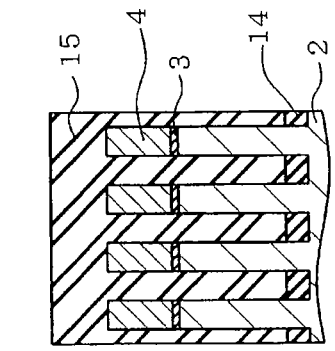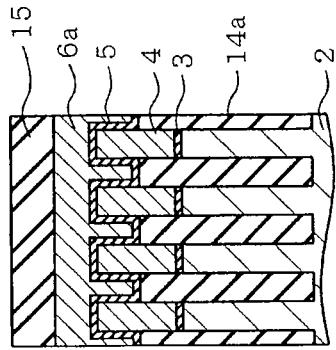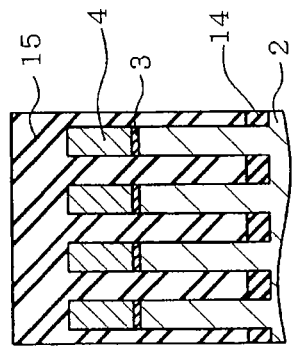
FIG. 36A
FIG. 36B
FIG. 36C
FIG. 36D
FIG. 36E

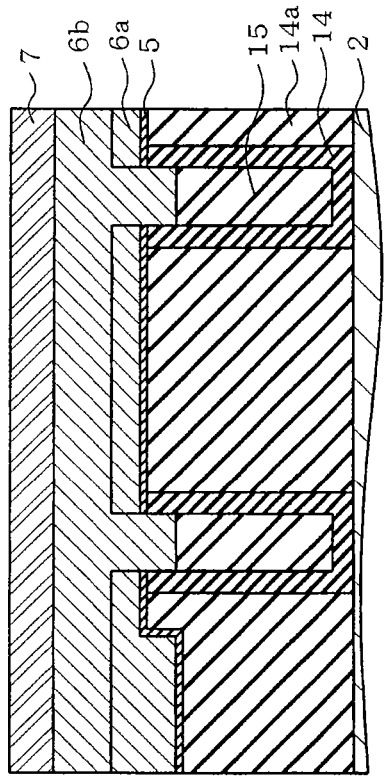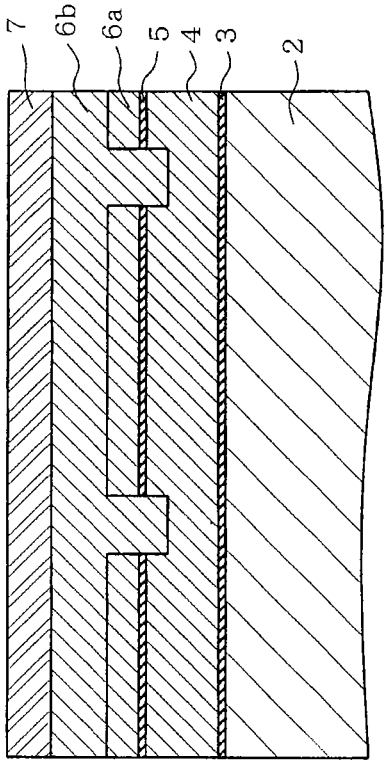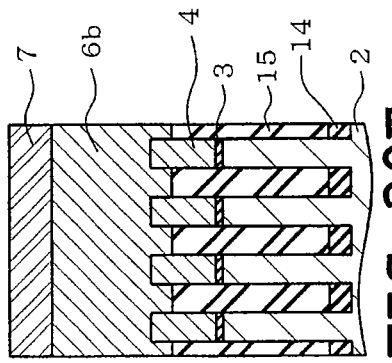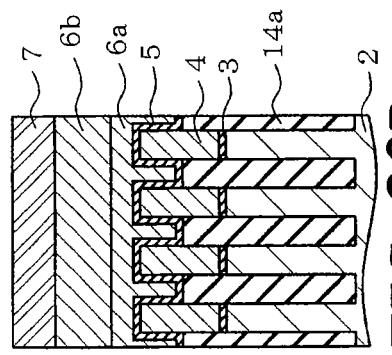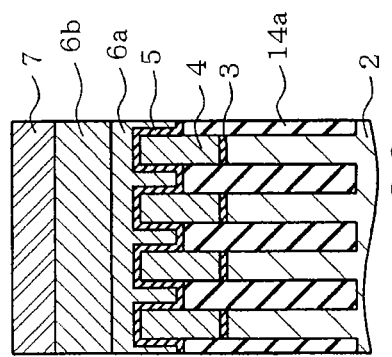

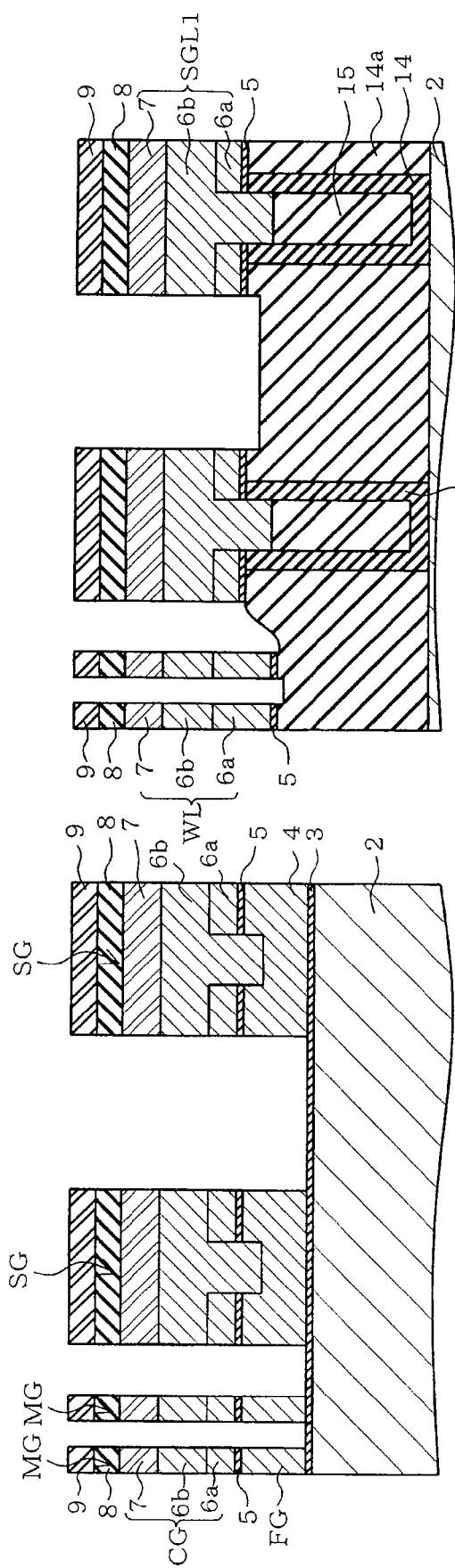
FIG. 40A
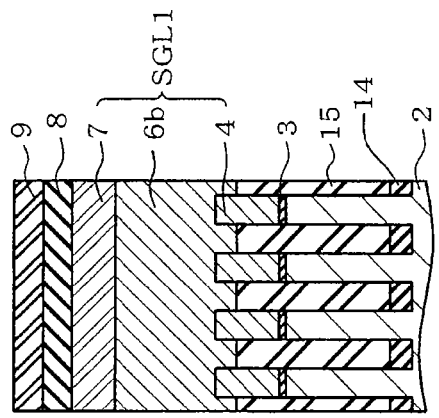
FIG. 40B
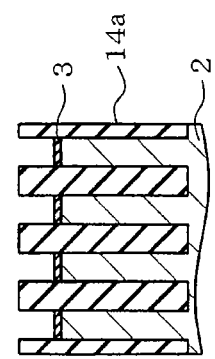
FIG. 40D
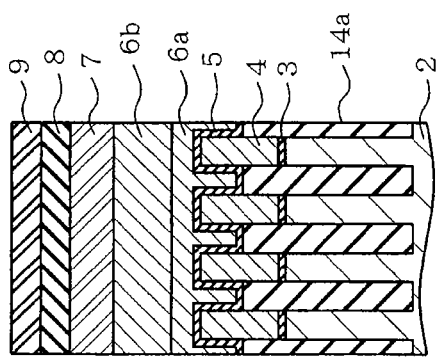
FIG. 40C
FIG. 40E

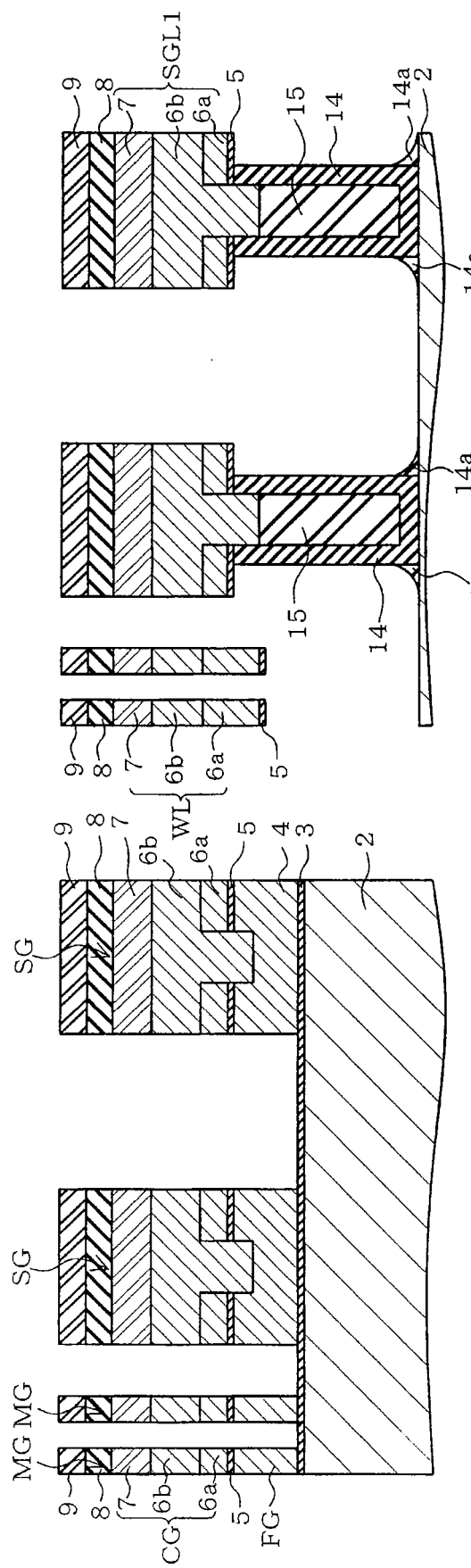

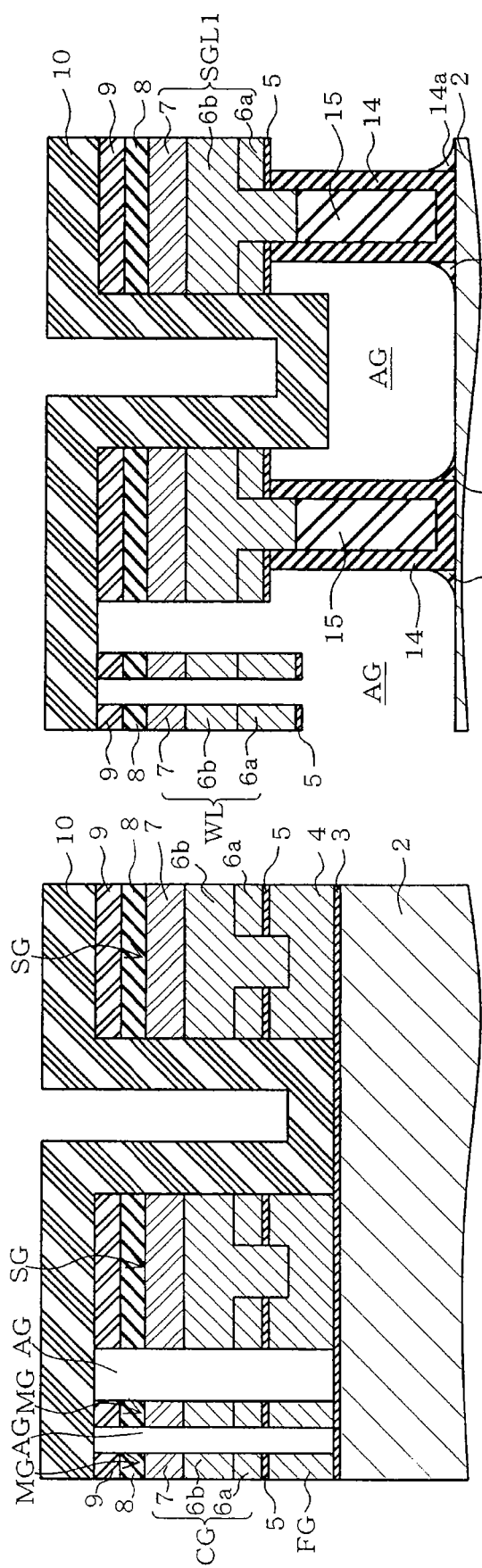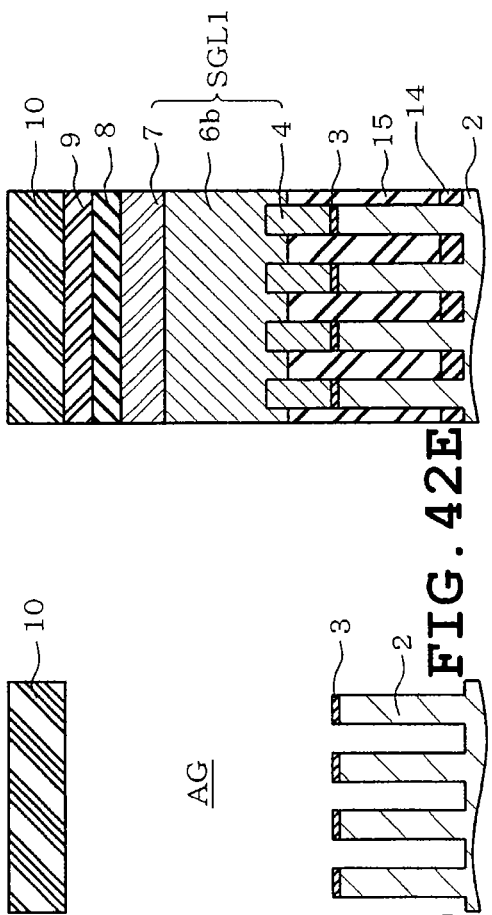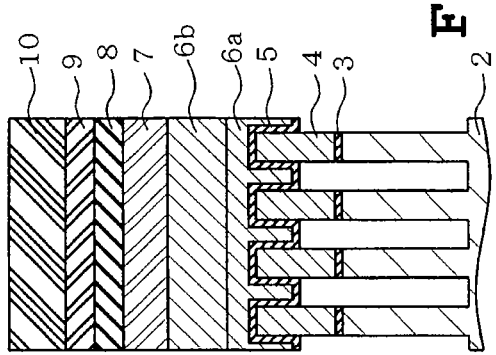
FIG. 42A
FIG. 42B
FIG. 42C
FIG. 42D
FIG. 42E

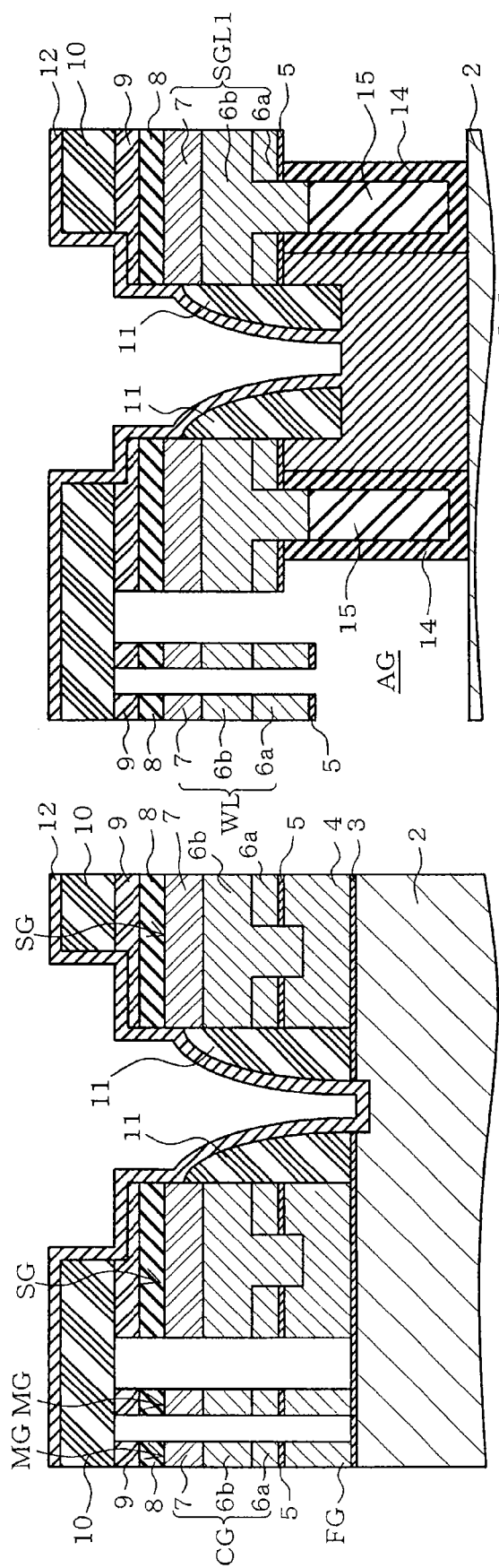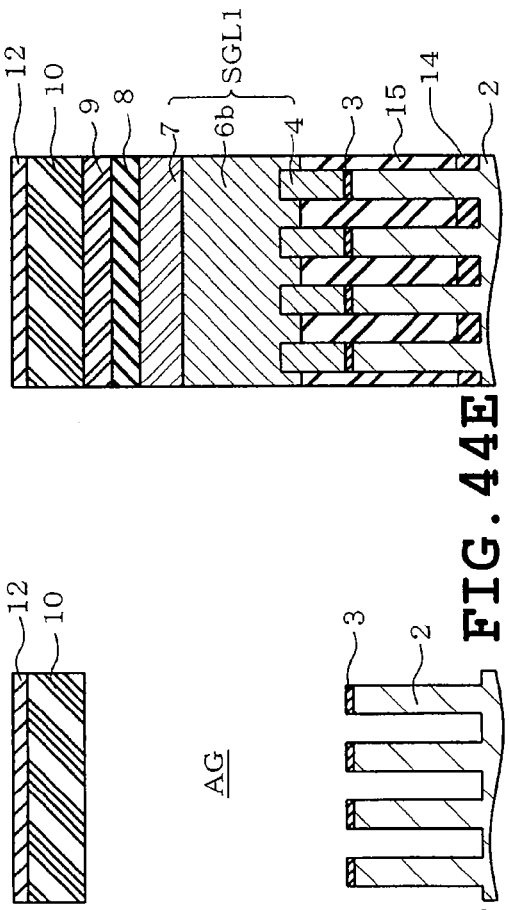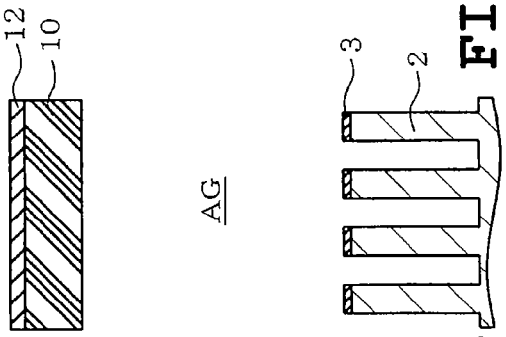
FIG. 44A
FIG. 44B
FIG. 44C
FIG. 44D
FIG. 44E

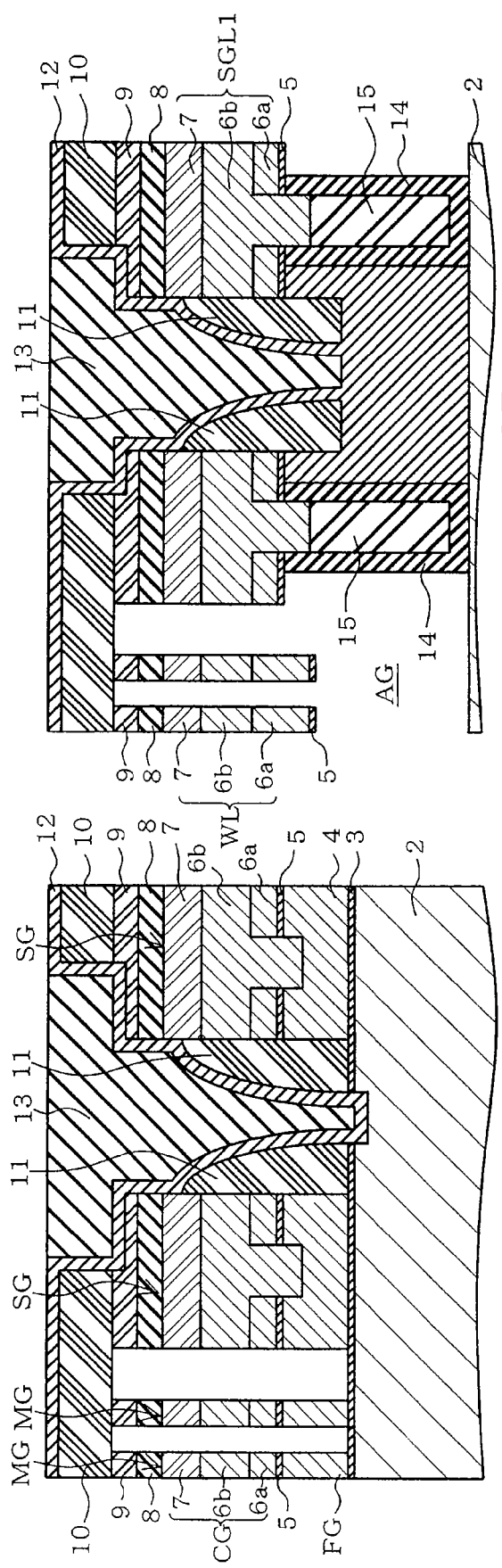
FIG. 45A
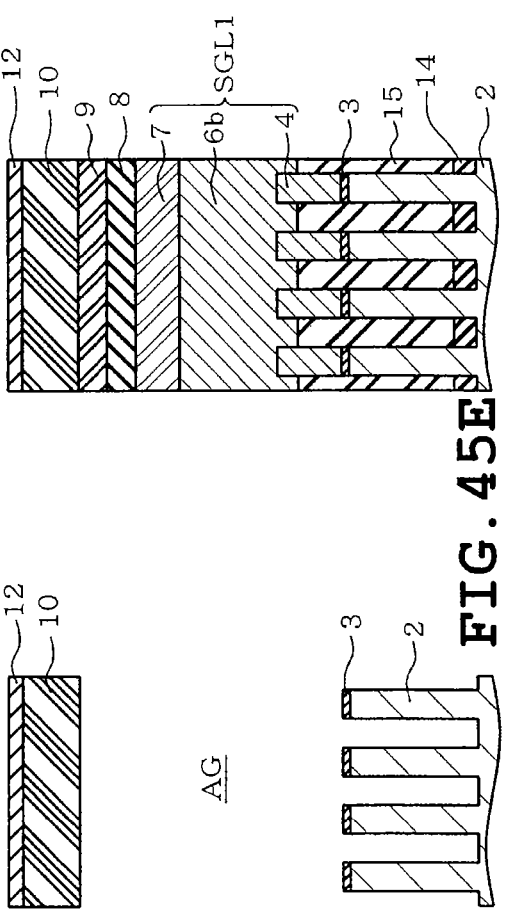
FIG. 45B
FIG. 45C
FIG. 45D
FIG. 45E

METHOD OF MANUFACTURING SEMICONDUCTOR STORAGE DEVICE AND SEMICONDUCTOR STORAGE DEVICE

CROSS-REFERENCE TO RELATED APPLICATION(S)

This application is based upon and claims the benefit of priority from Japanese Patent Application No. 2012-067401, filed on, Mar. 23, 2012 the entire contents of which are incorporated herein by reference.

FIELD

Embodiments disclosed herein generally relate to a method of manufacturing semiconductor storage device and a semiconductor storage device.

BACKGROUND

Semiconductor storage device such as a NAND flash memory is facing increasing demand for further microfabrication. Narrower gate width and gate length of the memory cell requires smaller spacing between the adjacent memory-cell gate electrodes and thereby increases parasitic capacitance of the memory-cell gate electrodes to an unignorable level.

Parasitic capacitance expands the range of threshold voltage distribution and thus, leads to degradation in data reliability. The memory cells are typically isolated by providing an element isolation region between the adjacent memory cells and filling the element isolation region with an insulating film. However the relative dielectric constant of the fill insulating film is greater than 1. One approach for reducing capacitive coupling is providing an air gap in the element isolation region.

A typical air gap formation in the element isolation region includes formation of an insulating film to enclose the air gaps. However, formation of the insulating film after the formation of the air gap may cause refilling of the air gaps by the insulating film. Further, an element isolation region mostly configured by an air gap exhibits good electric properties but is not as strong as an element isolation region filled with an insulation film.

BRIEF DESCRIPTION OF THE DRAWINGS

FIGS. 3A, 3B, 3C, 3D, and 3E pertain to the first embodiment and each illustrate a schematic example of a vertical cross-sectional view taken along lines A-A, B-B, C-C, D-D, and E-E of FIG. 2, respectively.

FIG. 4A pertains to the first embodiment and is one schematic example of a perspective view illustrating air gaps formed between word lines and air gaps formed in element isolation trench.

FIG. 4B pertains to the first embodiment and is one schematic example of a perspective view illustrating the structure of a boundary wall of an air gap located below a select gate line.

FIG. 5A-FIG. 5E to FIG. 25A-FIG. 25E pertain to the first embodiment and each illustrate one schematic example of a vertical cross sectional view of one phase of the manufacturing process flow.

FIGS. 26A to 26E pertain to a second embodiment and each illustrate a schematic example of a vertical cross-sectional view corresponding to FIGS. 3A to 3E.

FIGS. 28A-28E to FIGS. 45A-45E pertain to the second embodiment and each illustrate one schematic example of a vertical cross sectional view of one phase of the manufacturing process flow.

DESCRIPTION

In one embodiment, a method of manufacturing a semiconductor storage device is disclosed. The method includes forming a first gate insulating film and a first gate electrode film in the listed sequence above a first region and a second region of a semiconductor substrate; forming an element isolation trench along a first direction into the first gate electrode film, the first gate insulating film, and an upper portion of the semiconductor substrate to define a plurality of element regions extending in the first direction and being isolated from one another in a second direction intersecting with the first direction; filling the element isolation trench with a sacrificial film; forming an interelectrode insulating film along the first gate electrode film and the sacrificial film; forming a second gate electrode film above the interelectrode insulating film; forming, in the first region, a first trench extending through the second gate electrode film and the interelectrode insulating film, and a second trench extending through the second gate electrode film and the interelectrode insulating film and extending partially into the sacrificial film in the element isolation trench; filling the second trench with a first insulating film; forming a third gate electrode film above the second gate electrode film and into the first trench such that the third gate electrode film physically contacts the first gate electrode film through the first trench in the first region; etching the third gate electrode film, the second gate electrode film, the interelectrode insulating film, and the first gate electrode film along the second direction to form a plurality of select gate electrodes in the first region and a group of adjacent memory-cell gate electrodes in the second region; removing at least an upper portion of the sacrificial film; and forming a second insulating film over the element regions and over the element isolation trench to define an unfilled gap in the element isolation trench located between the element regions below a group of the memory-cell gate electrodes.

First Embodiment

A first embodiment is described hereinafter through a NAND flash memory application with references to FIGS. 1 to 25E. The drawings are not drawn to scale and thus, do not reflect the actual measurements of the features such as the correlation of thickness to planar dimensions and the relative thickness of different layers. Further, directional terms such as up, upper, upward, down, lower, downward, left, leftward, right, and rightward are used in a relative context with an assumption that the worked surface of the later described semiconductor substrate faces up. Thus, the directional terms do not necessarily correspond to the directions based on gravitational acceleration.

The description begins with a brief overview of the structure of one embodiment of a NAND flash memory.

Figure 1:
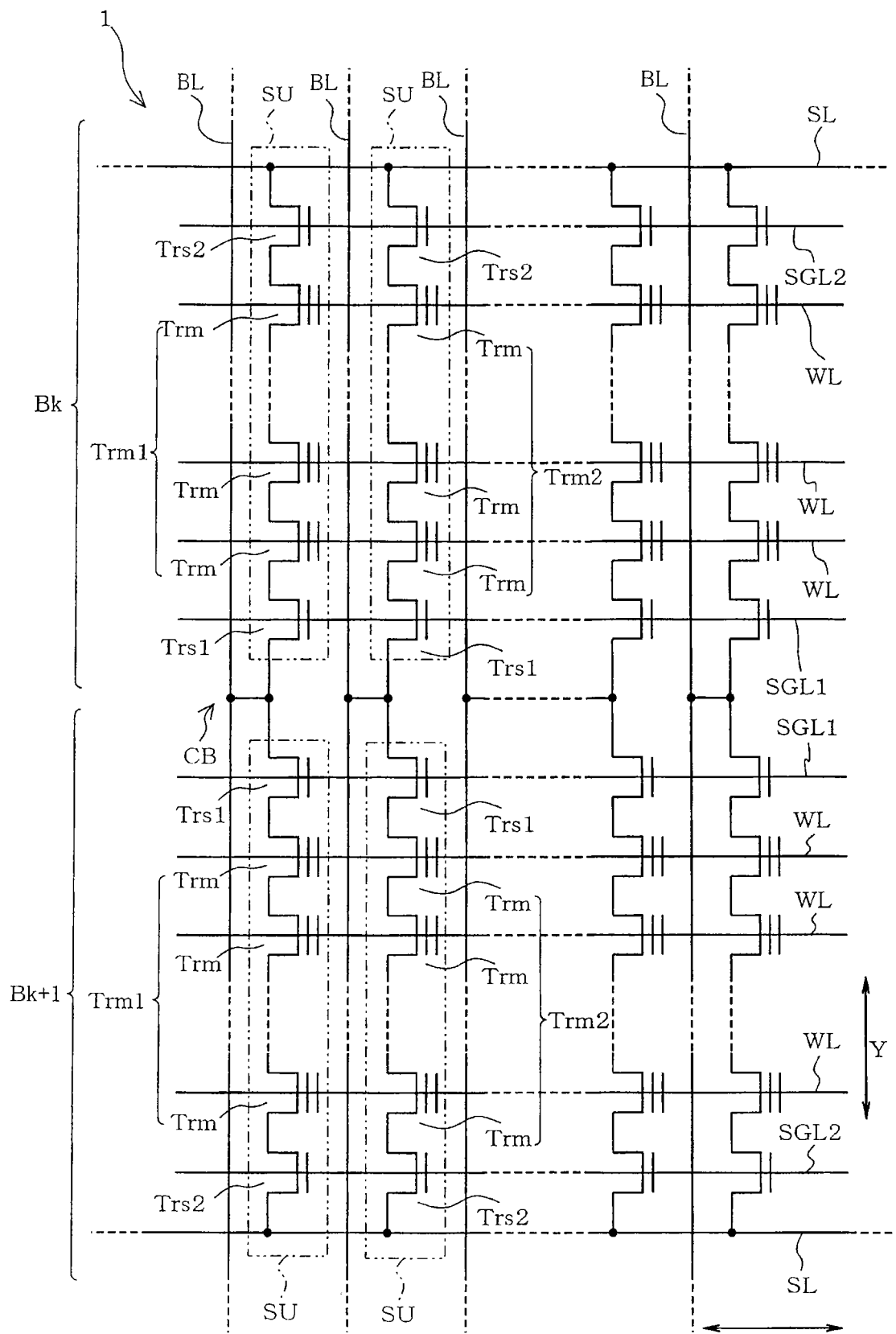
FIG. 1 pertains to a first embodiment and illustrates one schematic example of a partial equivalent circuit representation of a semiconductor storage device.

FIG. 1 is one example of a partial equivalent circuit representation of a memory cell array located in a memory cell region of NAND flash memory 1.

Referring to FIG. 1, the memory cell array includes multiplicity of units of cells also referred to as NAND cell unit SU or a NAND string arranged in rows and columns. NAND cell unit SU comprises a multiplicity of series connected memory cell transistors Trm, such as 64 in number, situated between a couple of select transistors Trs1 and Trs2 that are located at Y-direction ends of NAND cell unit SU. The neighboring memory cell transistors Trm within NAND cell unit SU share their source/drain regions.

The X-direction aligned memory cell transistors Trm shown in FIG. 1 are interconnected by common word line WL extending in the X direction, whereas the X-direction aligned select transistors Trs1 are interconnected by common select gate line SGL1 extending in the X direction and likewise, the X-direction aligned select transistors Trs2 are interconnected by common select gate line SGL2 also extending in the X direction.

The drain of each select transistor Trs1 located on one end of NAND cell unit SU is coupled to bit line BL by way of bit line contact CB shown in FIG. 1. Bit line BL extends in the Y direction orthogonal to the X direction shown in FIG. 1. The source of each select transistor Trs2 located on the other end of NAND cell unit SU is coupled to source line SL extending in the X-direction.

Figure 2:
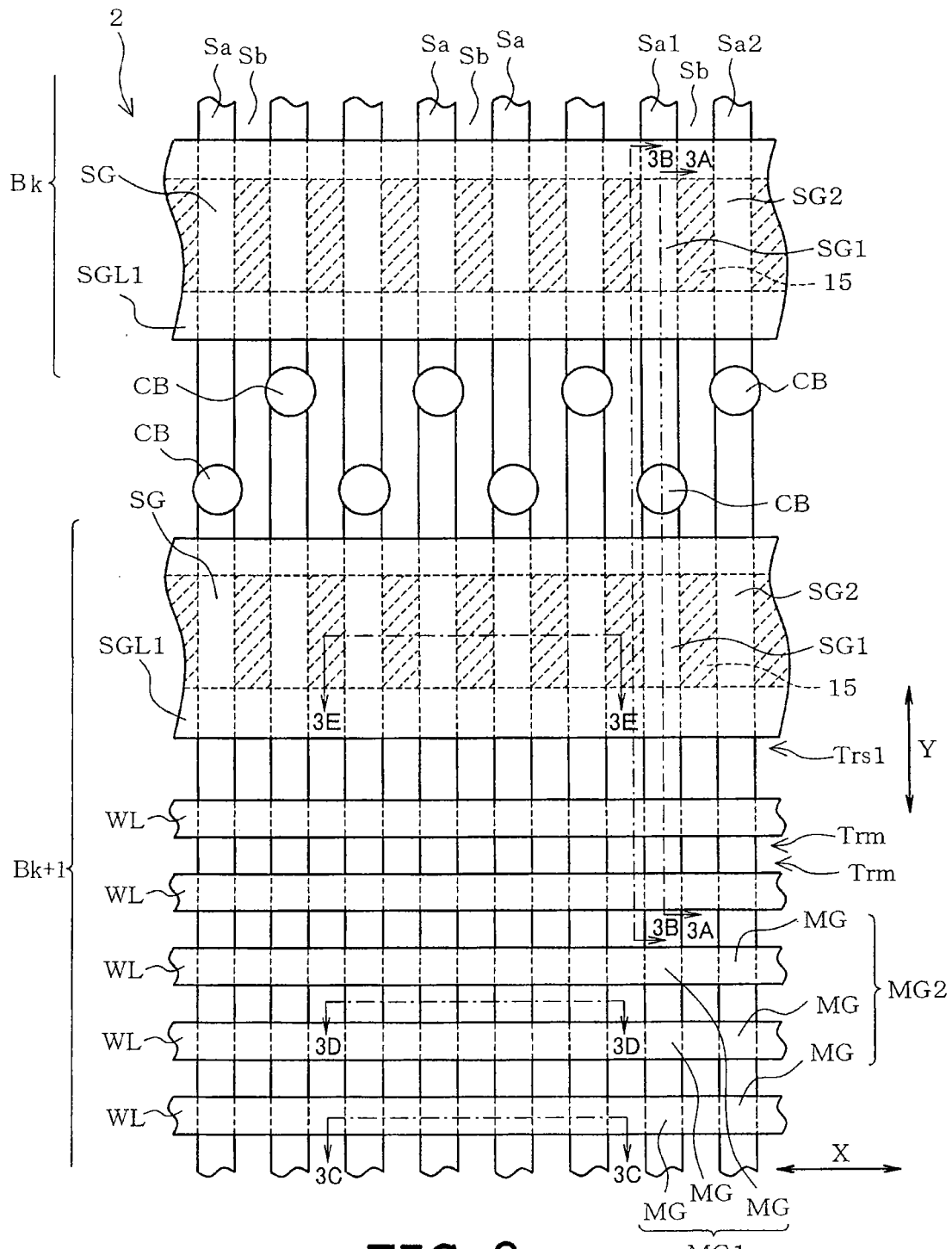
FIG. 2 pertains to the first embodiment and partially illustrates one schematic example of a planar layout of the semiconductor storage device.

FIG. 2 partially illustrates one example of a planar layout of the memory cell region. As shown, multiplicity of element isolation regions Sb run in the Y direction as viewed in FIG. 2 of a p-type silicon substrate 2, or more generally, a semiconductor substrate 2. Element isolation regions Sb are separated from one another in the X direction as viewed in FIG. 2 to isolate element regions Sa, running in the Y-direction, by a predetermined space interval in the X direction. The isolation employs a shallow trench isolation scheme known as STI.

Multiplicity of word lines WL, spaced from one another in the Y direction by a predetermined spacing, extend in the X direction as viewed in FIG. 2 which is the direction orthogonal to the Y direction in which element region Sa extends. Above element region Sa intersecting with word line WL, gate electrode MG of memory cell transistor Trm shown in FIG. 3A is formed. Gate electrode MG is also referred to as a second gate electrode. As described earlier, Y-directionally adjacent memory cell transistors Trm are situated between a couple of select transistors Trs1 and Trs2 that are located at Y-direction ends of NAND cell unit SU as shown in FIG. 1.

Multiplicity of select transistors Trs1 are aligned in the X direction and are electrically interconnected by a common select gate line SGL1 as described earlier. Select gate electrode SG shown in FIGS. 2 and 3 also referred to as a first gate electrode is formed above element region Sa intersecting with select gate line SGL1.

As shown in FIG. 1, multiplicity of select transistors Trs2 are aligned in the X direction and are interconnected by a common select gate line SGL2 as described earlier. Though not shown in FIGS. 2 and 3, select gate electrode SG also referred to as a first gate electrode is formed above element region Sa intersecting with select gate line SGL2. The select gate electrodes of select transistors are electrically interconnected by select gate line SGL2.

Still referring to FIG. 1, bit line contact CB is formed in each element isolation region Sa located between select transistors Trs1 of Y-directionally adjacent NAND cell units SU. As shown in FIG. 1 each of the Y-directionally adjacent NAND cell unit SU belongs to a different block, namely block $B_k$ and block $B_{k+1}$. Though not shown, a source line contact is formed in element region Sa located between a pair of select gate lines SGL2.

For ease of explanation, element region Sa extending along line 3A-3A of FIG. 2 will also be referred to as first element region Sa1 and the element region which is X-directionally adjacent to first element region Sa1 over element isolation region Sb is referred to as second element region Sat as required.

Still referring to FIG. 2, a group of memory-cell gate electrodes MG located above first element region Sa1 may also be referred to as first memory-cell gate electrode group MG1, and a group of memory-cell gate electrodes MG located above second element region Sa2 may also be referred to as second memory-cell gate electrode group MG2.

Referring back to FIG. 1, the group of memory cell transistors Trm in which first memory-cell gate electrode group MG1 serves as the gate electrode is also referred to as memory-cell transistor group Trm 1, and the group of memory cell transistors Trm in which first memory-cell gate electrode group MG2 serves as the gate electrode is also referred to as memory-cell transistor group Trm 2. Still referring to FIG. 1, memory-cell transistor group Trm 1 and memory-cell transistor group Trm 2 are X-directionally adjacent to one another.

FIG. 3A illustrates one example of a Y-direction cross sectional structure of a opposing pair of select gate transistor Trs1 as well as bit line contact CB located between the opposing select gate transistors Trs1.

As shown in FIG. 3A, gate insulating film 3 is formed above semiconductor substrate 2, which may, in one embodiment, be a p-type silicon substrate 2. First gate insulating film 3 may comprise a silicon oxide film, for example, and is formed above semiconductor substrate 2. First gate insulating film 3 is absent from the region of semiconductor substrate where bit line contact CB is located. First gate insulating film 3 located above first element region Sa1 is referred to as a first surface-layer gate insulating film and gate insulating film 3 above second element region Sa2 is referred to as a second surface-layer gate insulating film. Memory cell transistor Trm includes memory-cell gate electrode MG formed above gate insulating film 3 and source/drain region 2a.

Memory-cell gate electrode MG includes floating gate electrode FG, interelectrode insulating film 5, and control gate electrode CG stacked in the listed sequence. Floating gate electrode FG comprises polysilicon film 4 also referred to as a first gate electrode film doped with impurities. Source/drain region 2a is formed in the surface layer of semiconductor substrate 2 located beside the stacked gate electrode MG.

Interelectrode insulating film 5 is an intergate insulating film located between floating gate electrode FG and control gate electrode CG and may also be referred to as an interpoly insulating film and inter-conductive-layer insulating film. Interelectrode insulating film 5 may take an ONO structure comprising a stack of oxide/nitride/oxide films, which may be provided with additional bottom and top nitrides to take a NONON structure. Further, the middle nitride film may be replaced by a high dielectric constant insulating film such as alumina or hafnium oxide.

Control gate electrode CG comprises polysilicon film 6a and polysilicon film 6b stacked in the listed sequence. The upper portion of polysilicon film 6b is silicided by metal to reduce the resistivity of control gate electrode CG. Thus, stated differently, control gate electrode CG comprises a stack of polysilicon layer 6a, polysilicon layer 6b, and silicide layer 7. Metal such as tungsten (W) may be used in the silicidation. The upper portion of polysilicon film 6a may also be silicided.

FIG. 3A shows a string of memory cell transistors Trm aligned in the Y direction and select transistor Trs 1 at the end of the string. As shown, select gate electrode SG of select transistor Trm is substantially identical in structure to memory-cell gate electrode MG of memory cell transistor Trm and comprises polysilicon film 4, interelectrode film 5, polysilicon films 6a and 6b, and silicide layer 7 in the upper portion of polysilicon film 6a.

Select gate electrode SG differs from memory-cell gate electrode MG in that a through hole penetrates the central portion of interelectrode insulating film 5 to establish physical contact between polysilicon film 4 and polysilicon film 6b. Select gate electrode of select gate transistor Trs2 is structured in the same manner though a cross sectional view is not given.

As shown in FIG. 3A, an air gap or an unfilled gap represented by AG is provided between memory-cell gate electrodes MG. Provision of air gap AG suppresses the coupling capacitance between the adjacent memory-cell gate electrodes MG. Air gap AG is further provided between memory-cell gate electrode MG and select gate electrode SG. Though not shown, protective film comprising an oxide film is formed along the sidewalls of memory-cell gate electrode MG and select gate electrode SG.

Above each of gate electrodes MG and SG, silicon nitride film 8 and TEOS (tetraethyl orthosilicate) film 9 are stacked in the listed sequence. Silicon nitride film 8 serves as a cap film. Above TEOS film 9, silicon oxide film 10 serving as an interlayer insulating film is formed which extends across air gaps AG defined between gate electrodes MG and between gate electrodes MG and SG.

Referring to FIG. 3A, in the region between select gate electrodes SG, silicon oxide film 11 is formed along the sidewall of select gate electrode SG facing the opposing select gate electrode SG. Silicon oxide film 11 serves as a spacer insulating film for forming a deep and heavily doped diffusion layer 2b into a surface layer of semiconductor substrate 2 located in the inner side of silicon oxide film 11 where bit line contact CB is to be formed. Along the upper surface and sidewall of silicon oxide film 11, silicon oxide film 12 is formed which further extends along the upper surface and sidewall of silicon oxide film 10, the upper surface and sidewall of TEOS film 9, and the sidewall of silicon nitride film 8.

Above silicon oxide film 12, interlayer insulating film 13 comprising a silicon oxide film is formed so as to fill the gap between select gate electrodes SG. A through hole that extends into diffusion layer 2b of semiconductor substrate 2 is formed through interlayer insulating film 13 and silicon oxide film 12. The inner side of the through hole is lined with a barrier metal and filled with materials such as tungsten (W).

Description is given hereinafter on the regions where air gaps AG are formed. FIG. 4A primarily illustrates examples of air gaps AG located between Y-directionally adjacent word lines WL, in other words, Y-directionally adjacent memory-cell gate electrodes MG as well as air gaps AG located between X-directionally adjacent element regions Sa. FIG. 4B primarily illustrates air gaps AG located between Y-directionally adjacent select gate line SGL1 and word line WL.

As shown in FIG. 4B, element isolation region Sb comprises silicon oxide film 14 filled along the bottom surface of element isolation trench Sb1 and TEOS film 15 formed above silicon oxide film 14. Silicon oxide film 14 serves as the bottom surface of air gap AG whereas TEOS film 15 serves as the sidewall of air gap AG. The depth of air gap AG in element isolation region Sb is controlled to be equal to or greater than ½ of the Y-directional width of select gate electrode SG to thereby improve the performance of element isolation.

Referring to FIG. 3A, select gate electrode SG is formed above element region Sa. It can be understood from further reference to FIG. 3B that select gate electrodes SG are interconnected by select gate line SGL1 extending in the X direction, in other words, in the direction normal to the page of FIG. 3E.

The cross section of FIG. 3B shows that select gate line SGL1 comprises a stack of polysilicon 6a, 6b, and silicide film 7. In one embodiment, TEOS film 15 comprising a silicon oxide film is formed immediately below select gate line SGL1 and air gap AG is formed on the word line WL side of TEOS film 15.

Referring to FIGS. 3B and 4B, air gap AG is provided in element isolation region Sb formed between element regions Sa and is located below word line WL. The portion of element isolation region Sb running between select gate lines SGL1 is enclosed by TEOS film 15 and filled with silicon oxide film 12. Thus, TEOS film 15 serves as a stopper or a wall to withhold silicon oxide film 12. Hence, air gap AG is not provided in the portion of element isolation region Sb running between select gate lines SGL1.

Referring to FIG. 3B, the gases for forming silicon oxide film 12 flows into element isolation region Sb through the gap between select gate line SGL1 of block $B_{k+1}$ and select gate line SGL 1 of block $B_k$. Thus, in the region below the upper surface of semiconductor substrate 2, silicon oxide film 12 is formed between TEOS film 15 located immediately below select gate line SGL1 of block $B_{k+1}$ and TEOS film 15 located immediately below select gate line SGL1 of block $B_k$.

Referring to FIGS. 2 and 3E, TEOS film 15 extends across element region Sa located immediately below select gate line SGL1 of block $B_{k+1}$ and element region Sa select gate line SGL1 of block $B_k$ thus, the formation of silicon oxide film 12 is blocked by TEOS film 15.

Figure 5A:
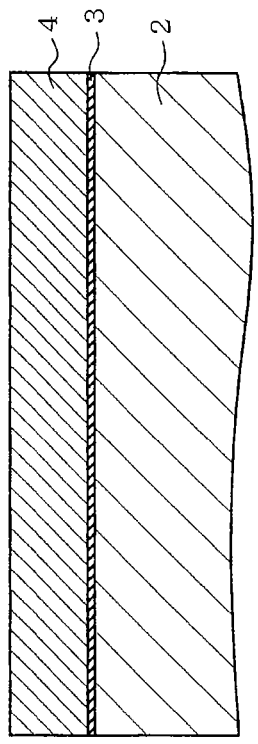
Figure 5B:
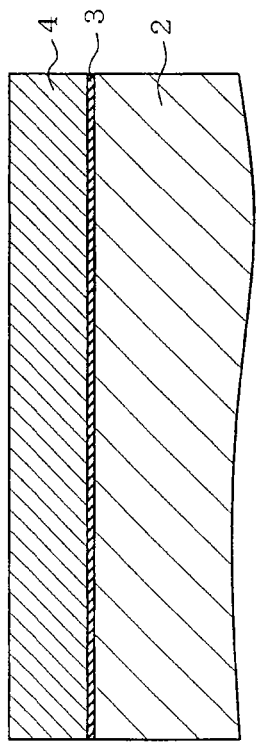
Figure 5C:
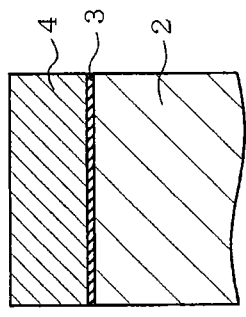
Figure 5D:
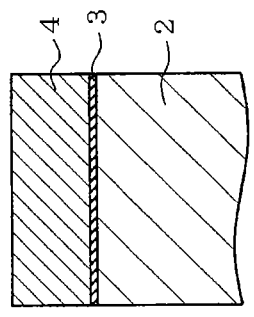
Figure 5E:
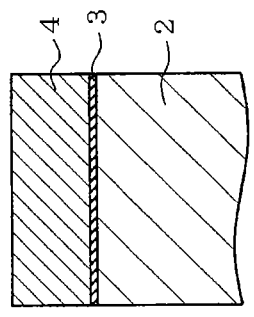
Figure 6A:
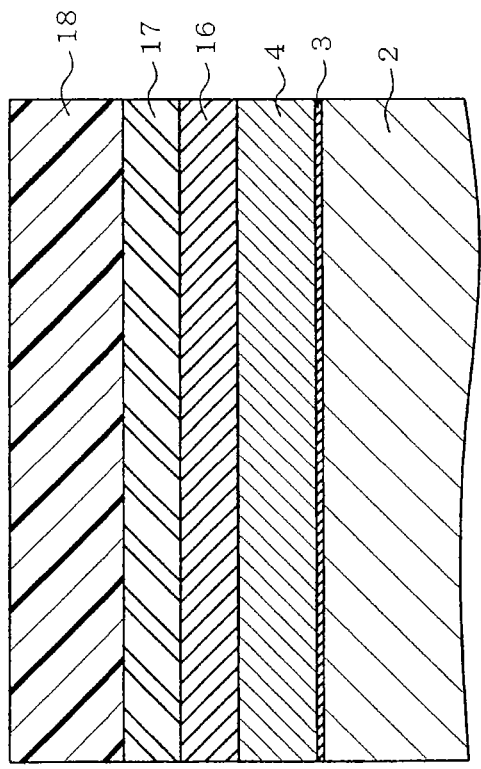
Figure 6B:
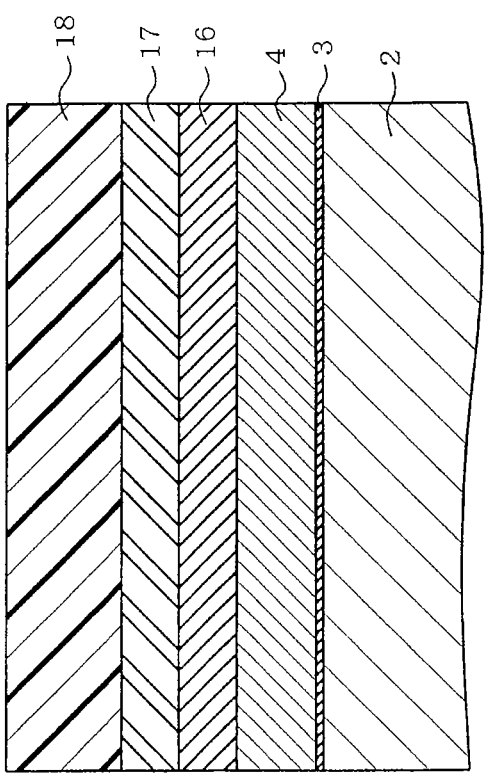
Figure 6C:
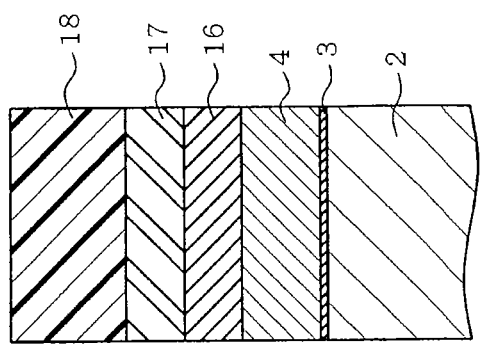
Figure 6D:
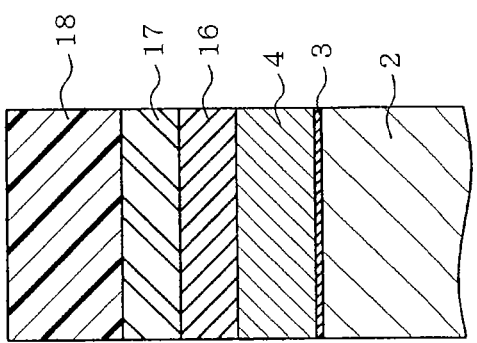
Figure 6E:
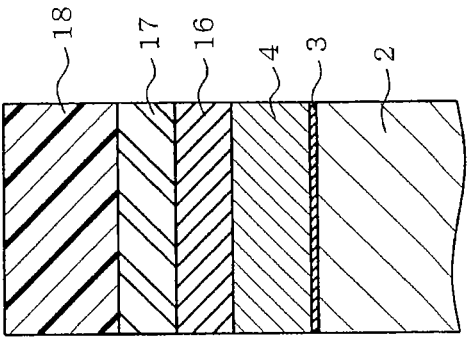
Figure 7A:
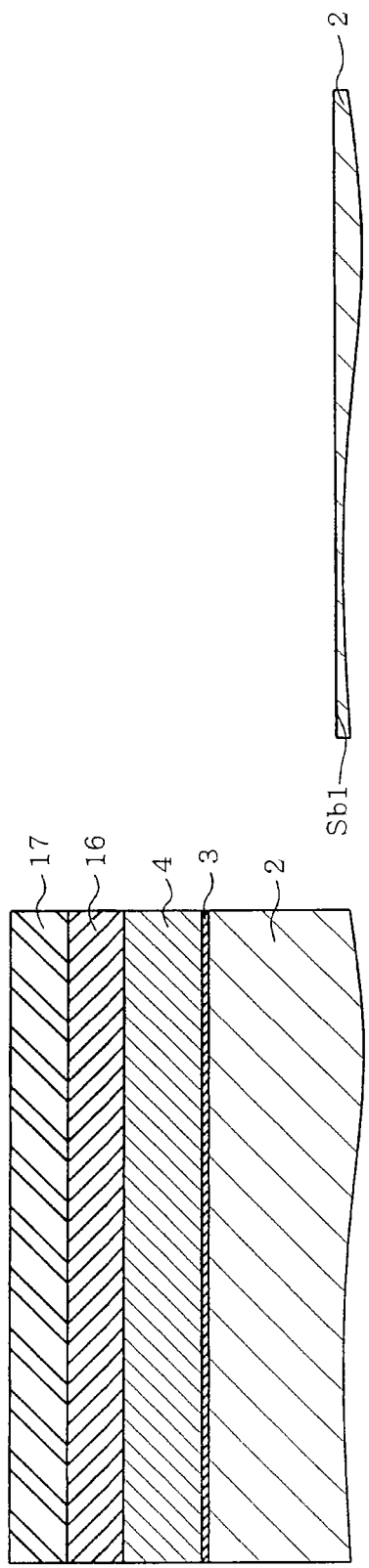
Figure 7B:
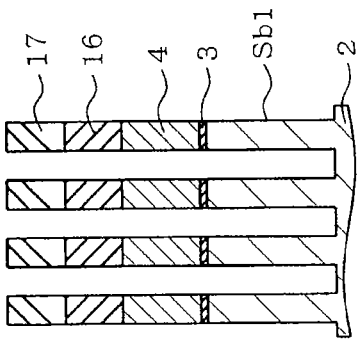
Figure 7C:
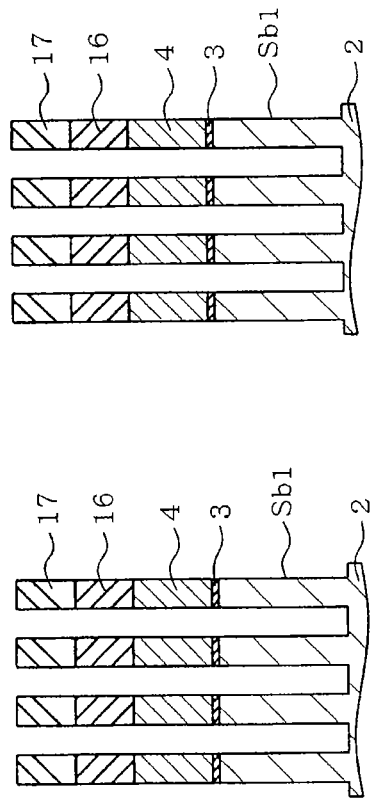
Figure 7D:
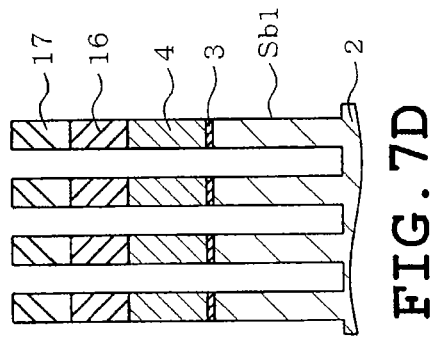
Figure 7E:
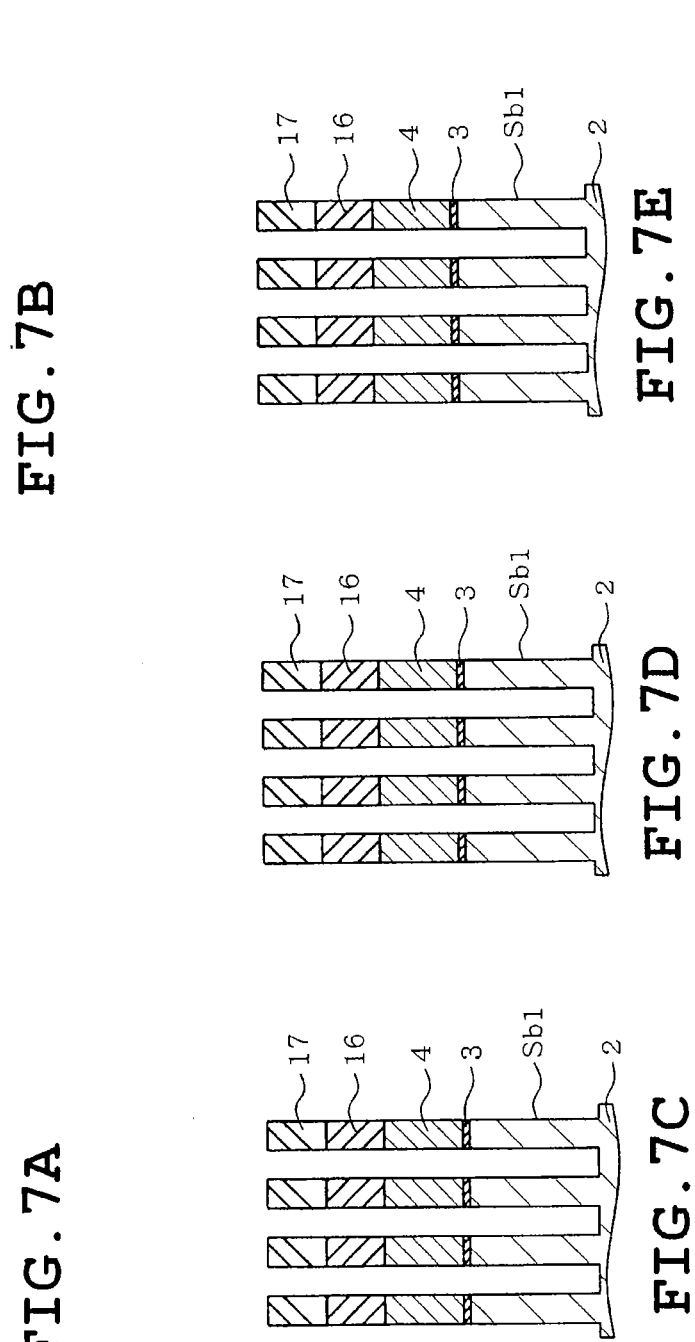
Figure 8A:
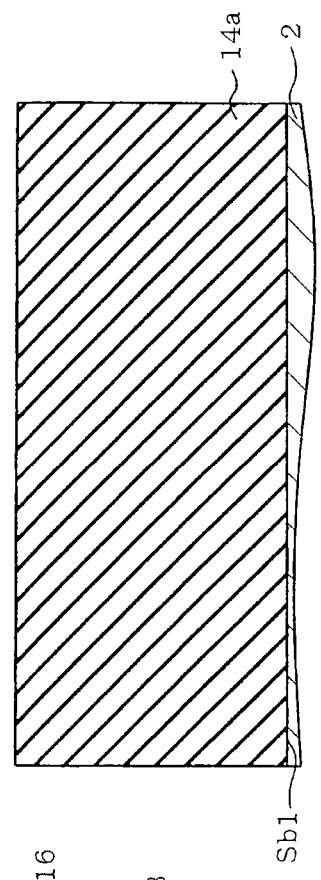
Figure 8B:
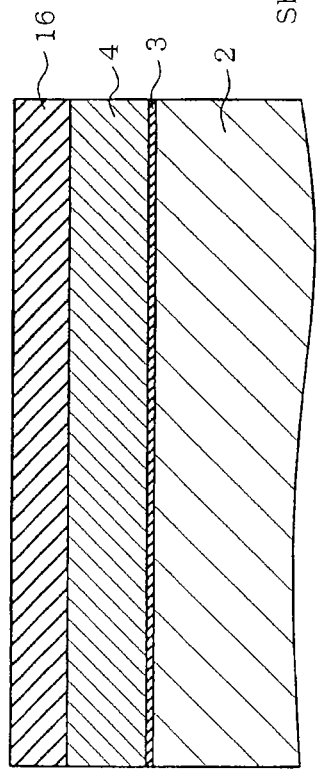
Figure 8C:
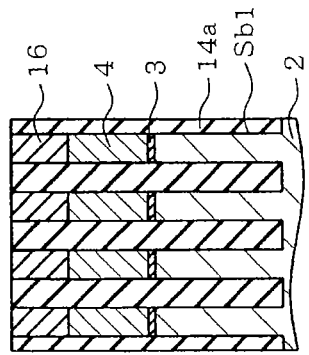
Figure 8D:
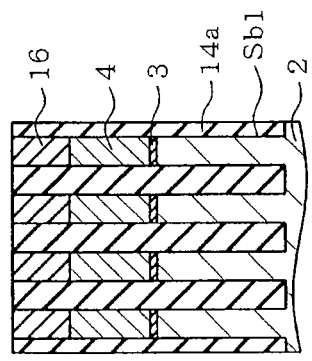
Figure 8E:
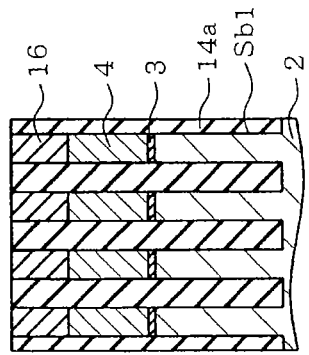
Figure 9A:
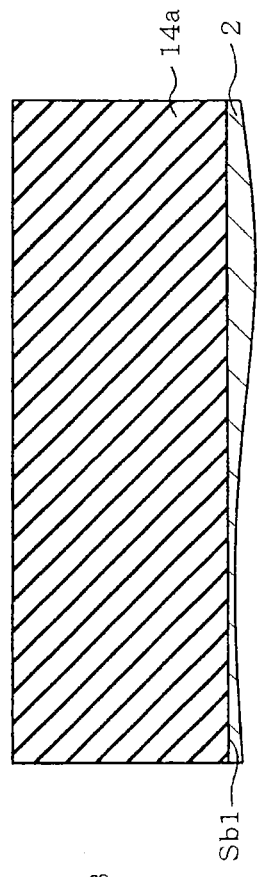
Figure 9B:
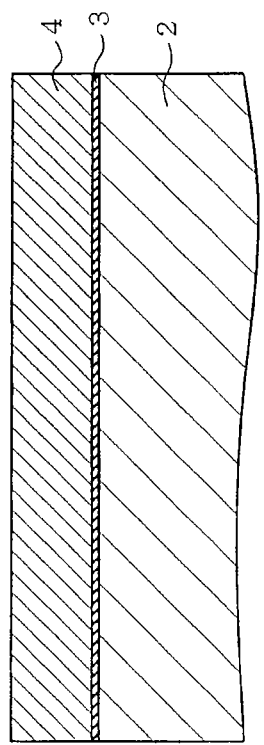
Figure 9C:
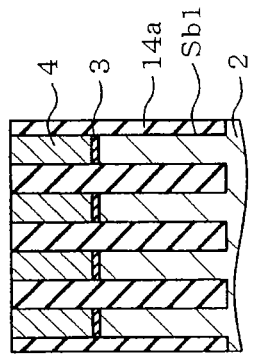
Figure 9D:
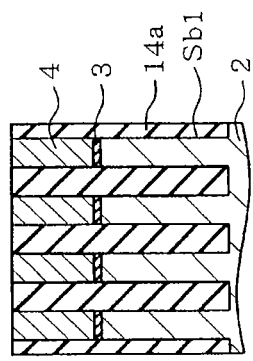
Figure 9E:
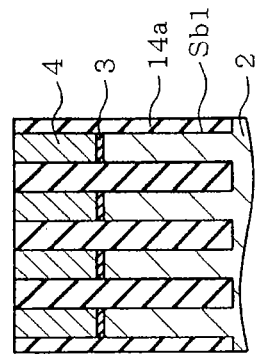
Figure 10B:
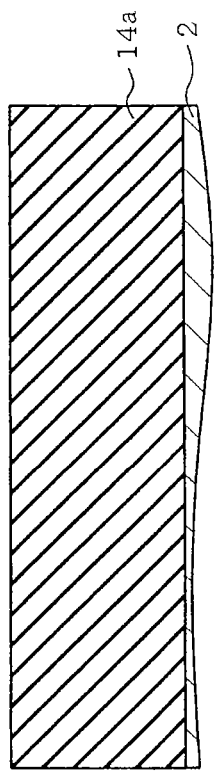
Figure 10A:
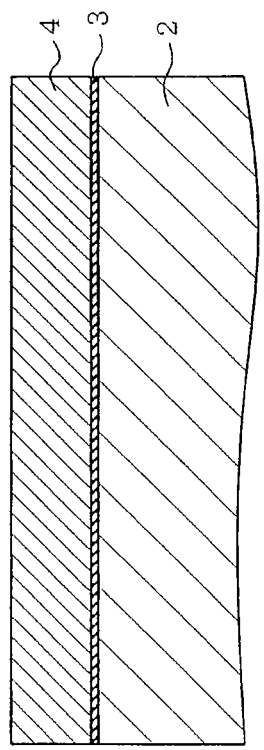
Figure 10E:
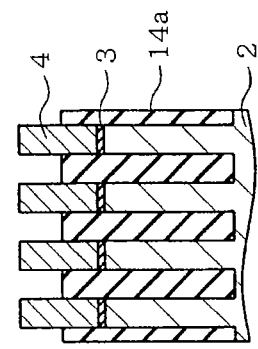
Figure 10D:
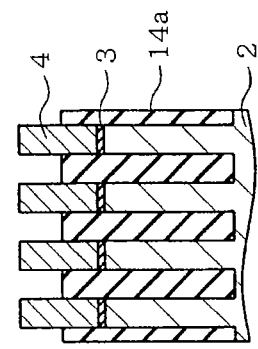
Figure 10C:
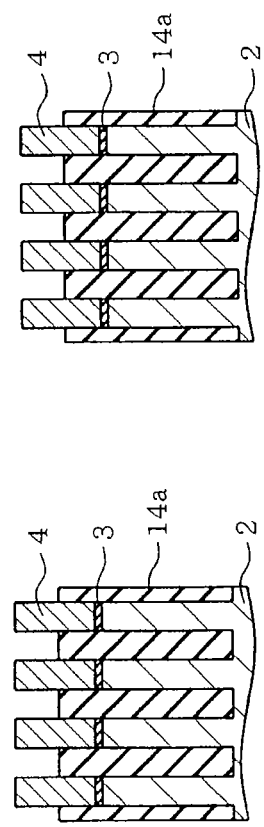
Figure 11A:
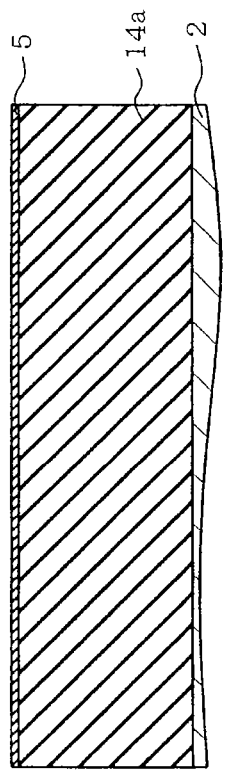
Figure 11B:
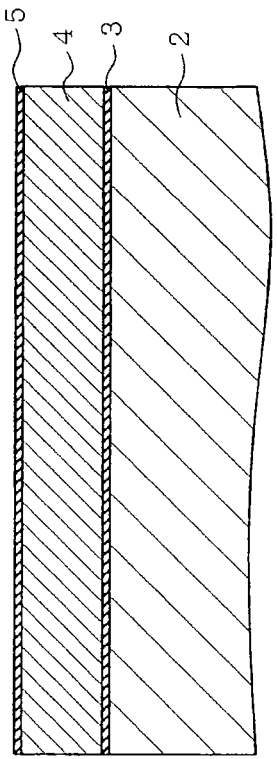
Figure 11C:
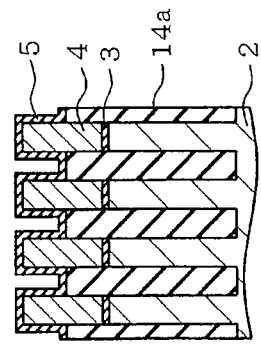
Figure 11D:
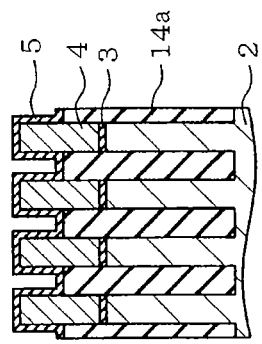
Figure 11E:
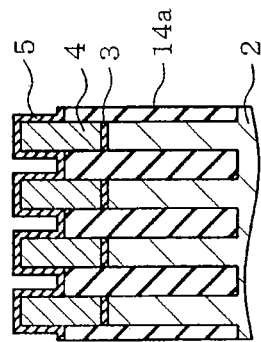
Figure 12A:
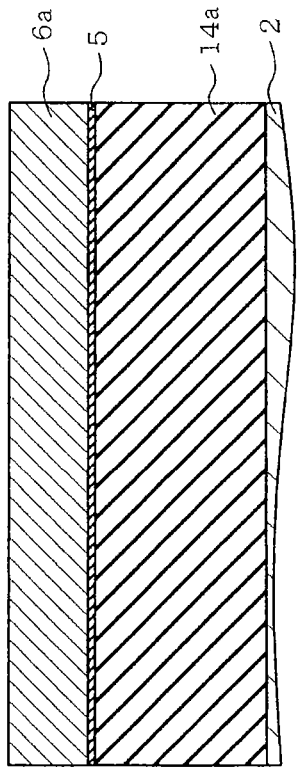
Figure 12B:
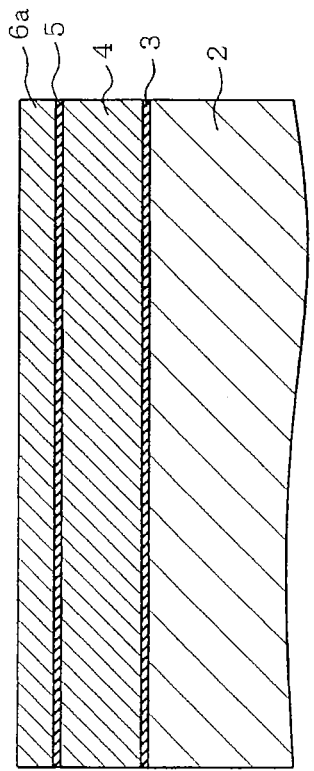
Figure 12C:
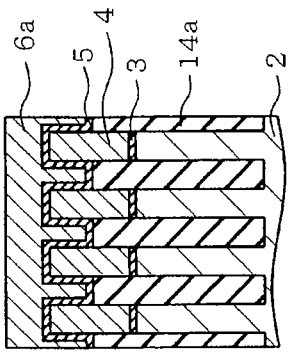
Figure 12D:
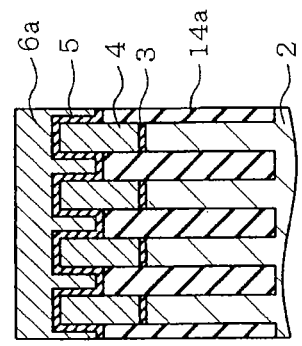
Figure 12E:
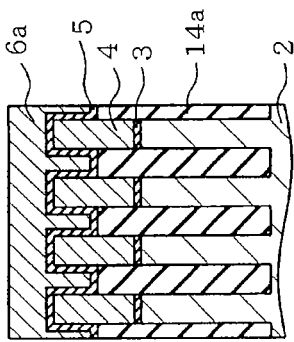
Figure 13A:
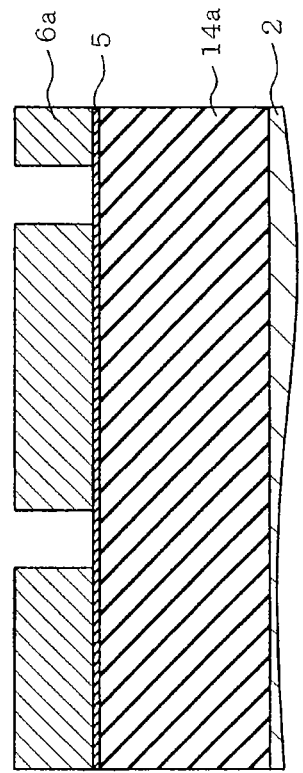
Figure 13B:
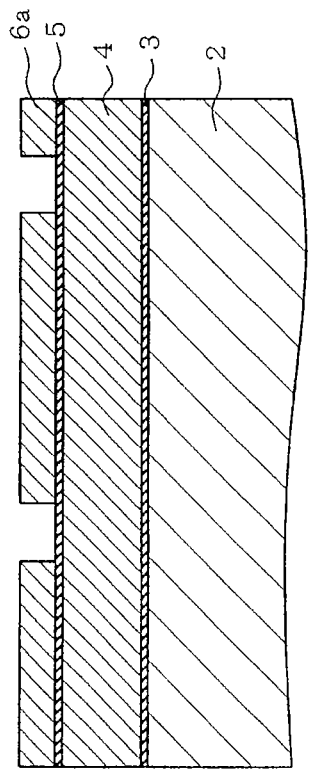
Figure 13C:
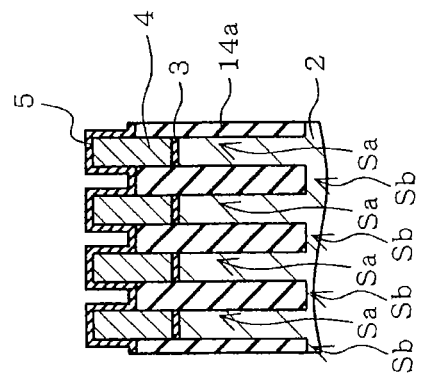
Figure 13D:
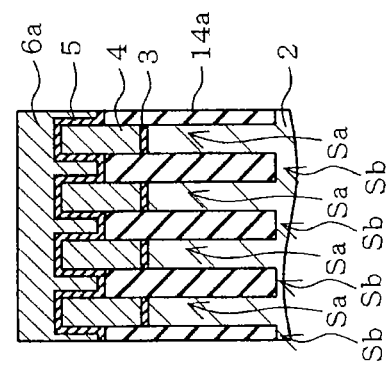
Figure 14D:
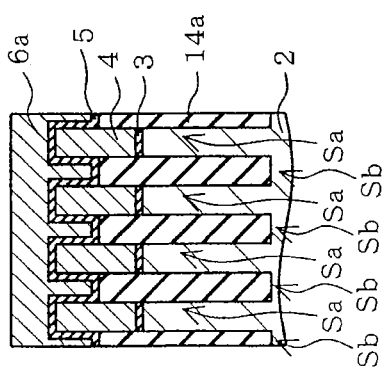
Figure 14:
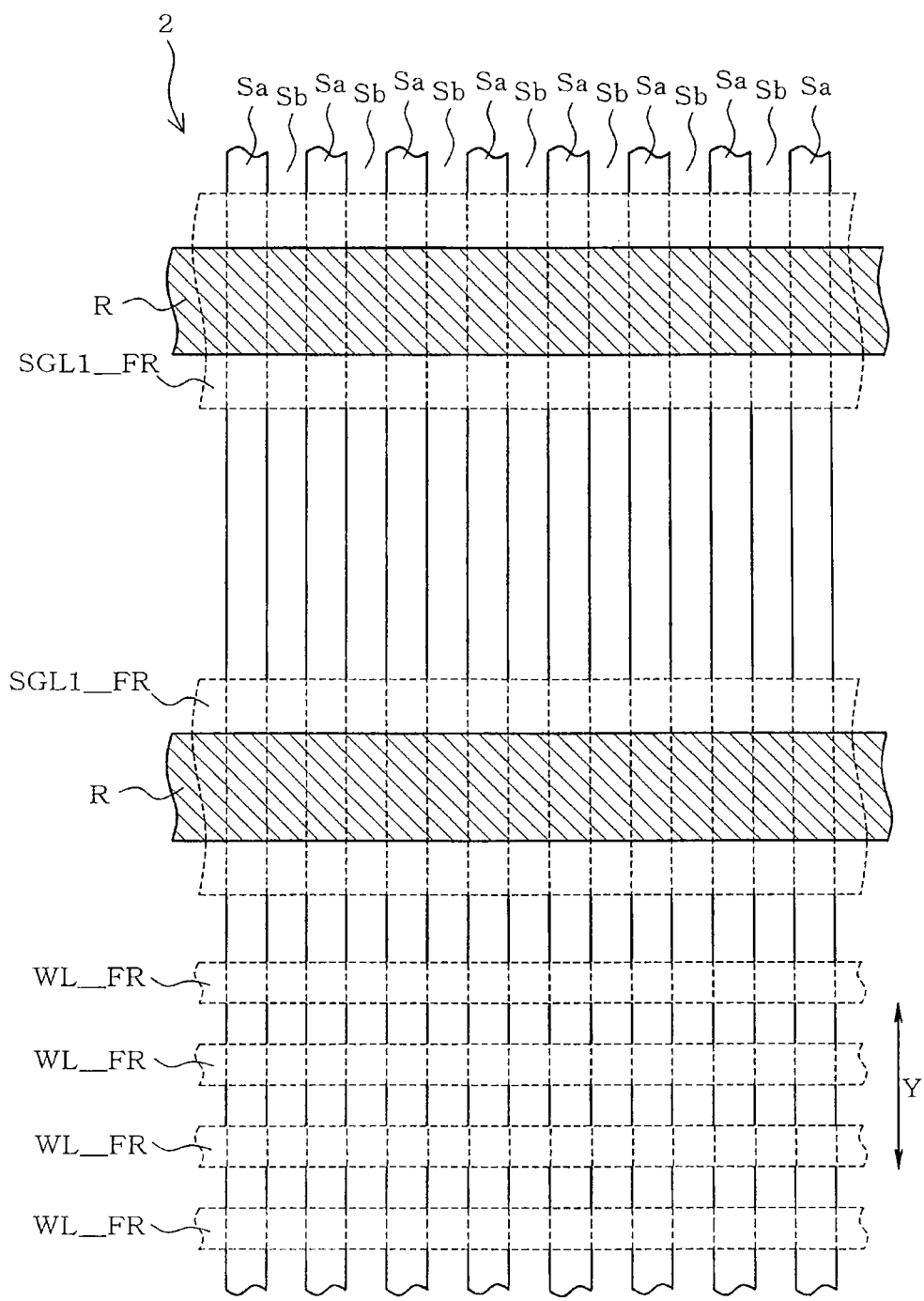

Next, a description will be given on one example of a manufacturing process flow of the above described structure with reference to FIG. 5A and beyond. The description of the manufacturing process flow will be given with sequential reference to the drawings beginning with FIG. 5A. The following descriptions will focus on the features of the embodiments and thus, known steps may be added or removed from the process flow as required. Further, the sequence of the process flow may be rearranged if practicable.

Referring to FIG. 5A to 5E, a gate insulating film 3 is formed above semiconductor substrate 2. In one embodiment, semiconductor substrate comprises a p-type silicon substrate and thus, a silicon oxide film is formed by thermal oxidation to obtain gate insulating film 3 also referred to as first/second gate insulating film depending upon location. Polycrystalline silicon film 4 later formed into floating gate electrode is deposited above gate insulating film 3 by LPCVD (Low Pressure Chemical Vapor Deposition). Polycrystalline silicon film 4 is doped with n-type impurities such as phosphorous (P).

Referring to FIGS. 6A to 6E, Silicon nitride film 16 is deposited in appropriate thickness above polycrystalline silicon film 4. Above silicon nitride film 16, oxide film 17 serving as a hard mask is deposited in appropriate thickness. Resist 18 is further coated over oxide film 17.

Referring to FIGS. 7A to 7E, resist 18 is exposed and thereafter developed into a line and space pattern of a predetermined pitch.

Then, using the patterned resist as a mask, oxide film 17 is anisotropically etched to define element isolation trench Sb1 isolated in the X direction. Resist 18 is removed after the etching.

Using oxide film 17 as a mask, silicon nitride film 16 is anisotripically etched by RIE. Polycrystalline silicon film 4, gate insulating film 3, and the upper portion of silicon substrate 2 is further anisotropically etched by a predetermined pitch to form element isolation trench Sb1.

Referring to FIGS. 8A to 8E, element isolation trench Sb1 is filled with a polysilazane 14a coating liquid. Polysilzazane 14a is an organic compound having a molecular structure of ($SiH_2$—NH). Polysilazane 14a is planarized by CMP (Chemical Mechanical Polishing) until the upper surface of silicon nitride film 16 is exposed.

Referring to FIGS. 9A to 9E, the upper surface of polysilazane 14a is selectively etched back. The duration of etching is controlled such that the upper surface of polysilazane 14a is substantially level with the interface between polysilicon film 4 and silicon nitride film 16. Silicon nitride film 16 remaining above polysilicon film 4 is selectively removed, for instance, by wet etching. As a result, polysilicon film 4 serving as the first gate electrode film becomes substantially level with polysilazane 14a serving as a sacrificial film.

Referring to FIGS. 10A to 10E, the upper surface of polysilazane 14a is selectively etched back so as to be lower than the upper surface of polysilicon film 4 but higher than the upper surface of gate insulating film 3.

Referring to FIGS. 11A to 11E, interelectrode insulating film 5 is formed above the upper surface of polycrystalline silicon film 4 by deposition of films such as an ONO (Oxide-Nitride-Oxide) film by LPCVD. NONON film may be employed instead of the ONO film which may be obtained by radically nitriding the lowermost oxide film and the uppermost oxide film of the ONO film. Still alternatively, the middle nitride film of the ONO film may be replaced by a high dielectric constant film such a aluminum oxide also referred to as alumina.

Referring to FIGS. 12A to 12E, first polycrystalline silicon film 6a serving as the second gate electrode film is deposited by CVD.

Referring to FIGS. 13A to 13E and 14, region R of polysilicon film 6a is processed by lithography and anisotropic etching. Region R is located substantially on a Y-directional center of region SGL1_FR where select gate line SGL1 is to be formed. Region R is a region for establishing contact between polysilicon film 4 and polysilicon film 6b. As shown in FIGS. 13A to 13E, polysilicon film 6a deposited above interelectrode insulating film 5 is removed to define an opening without etching interelectrode insulating film 5 serving as an etch stop.

Figure 15A:
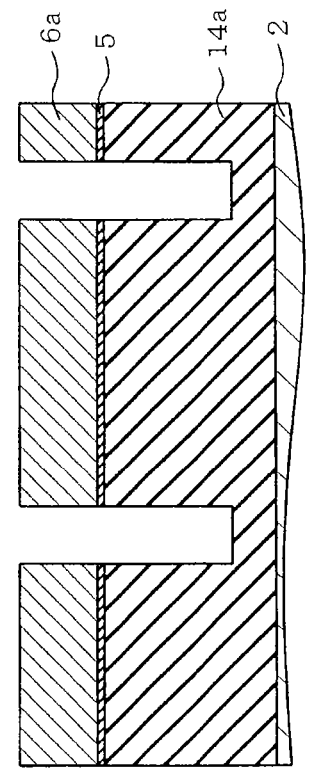
Figure 15B:
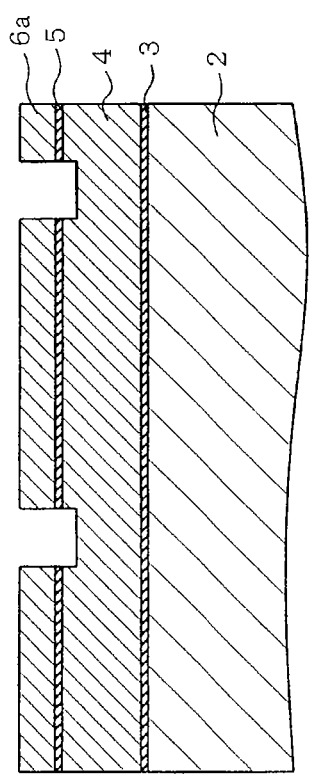
Figure 15C:
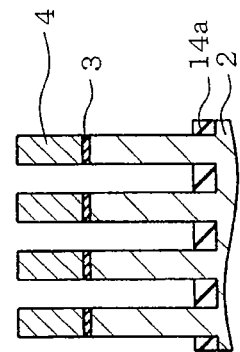
Figure 15D:
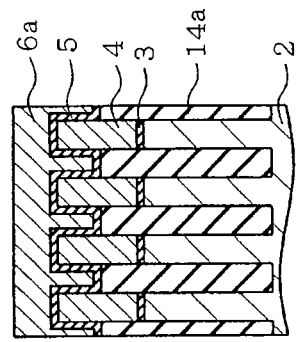

Referring to FIGS. 15A to 15E, interelectrode insulating film 5 and polysilazane 14a is etched back using polysilicon film 6a as a mask to deepen the opening into a trench. The etch back may be achieved through RIE and then wet etching using buffered hydrogen fluoride solution as a wet etchant. In an alternative embodiment, the wet etching may be omitted. Polysilazane 14a is etched with selectivity to polysilicon film 4 and thus, the depth of etching of polysilazane 14a shown in FIG. 15B is greater than the depth of etching of polysilicon film 4.

Referring to FIGS. 16A to 16E, for example, the trenches formed by the etch back is overfilled with TEOS film 15 deposited by LP-CVD.

Figure 17A:
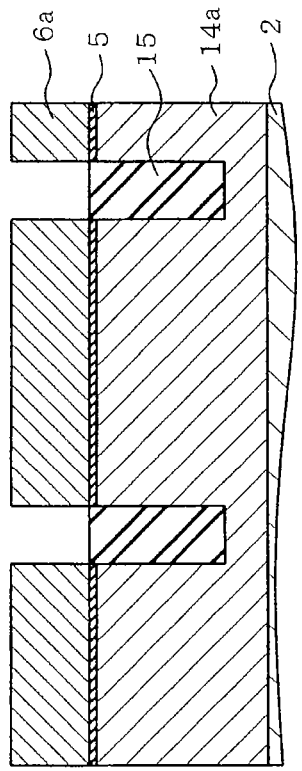
Figure 17B:
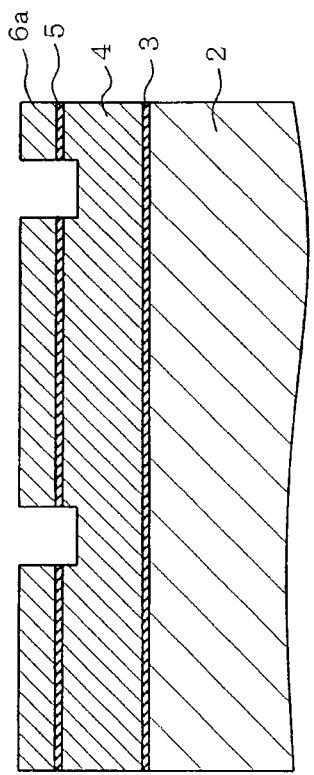
Figure 17E:
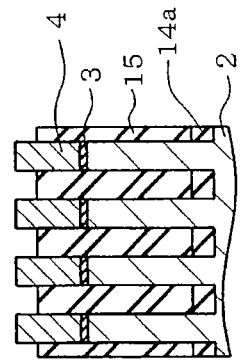
Figure 17D:
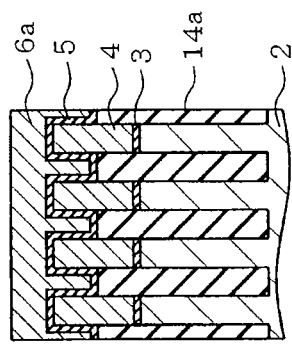
Figure 17C:
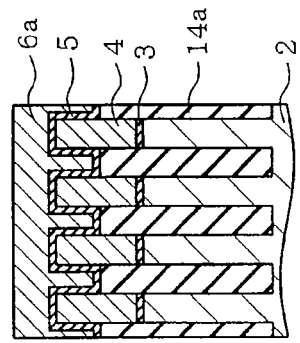
Figure 18A:
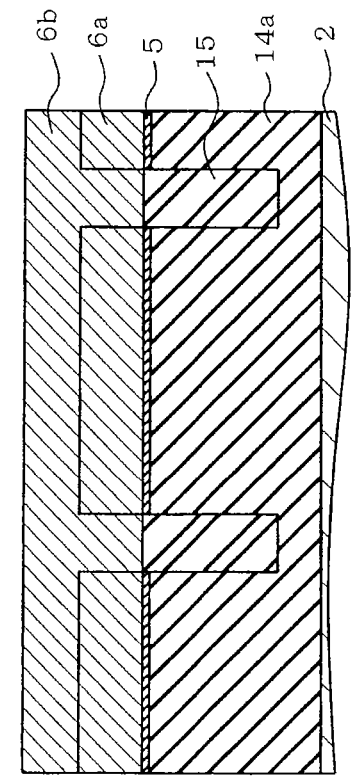
Figure 18B:
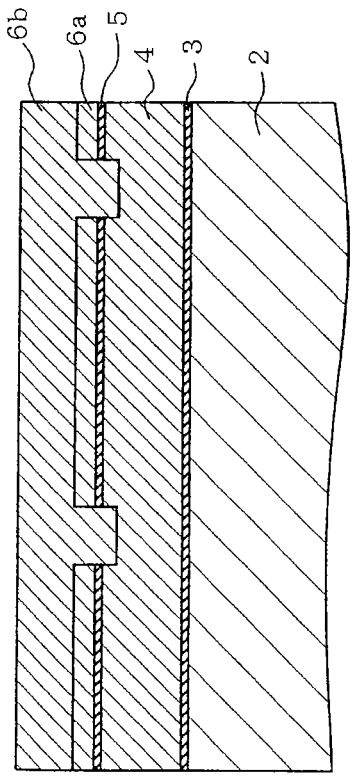
Figure 18C:
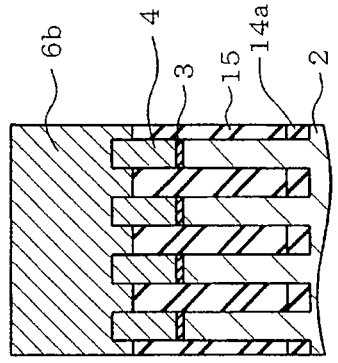
Figure 18D:
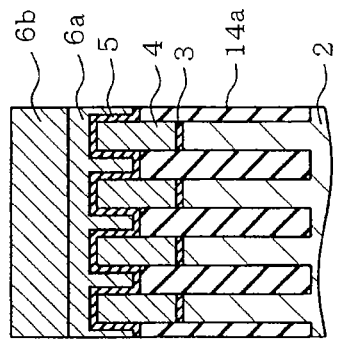
Figure 18E:
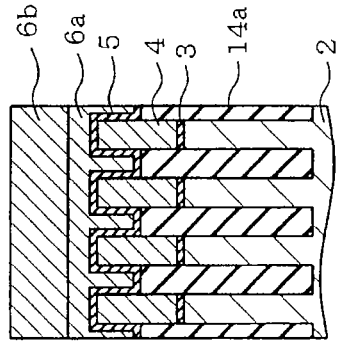
Figure 19A:
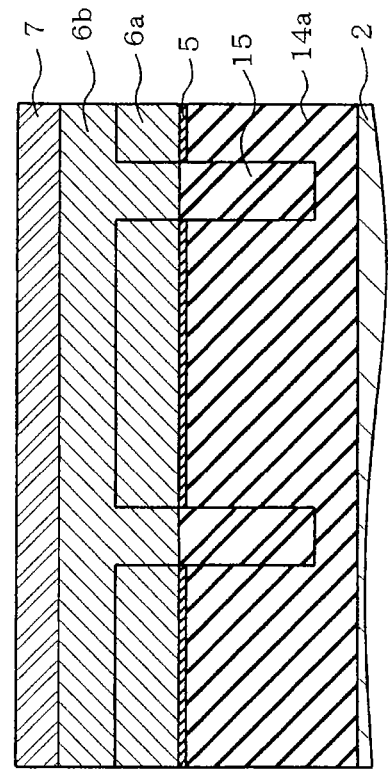
Figure 19B:
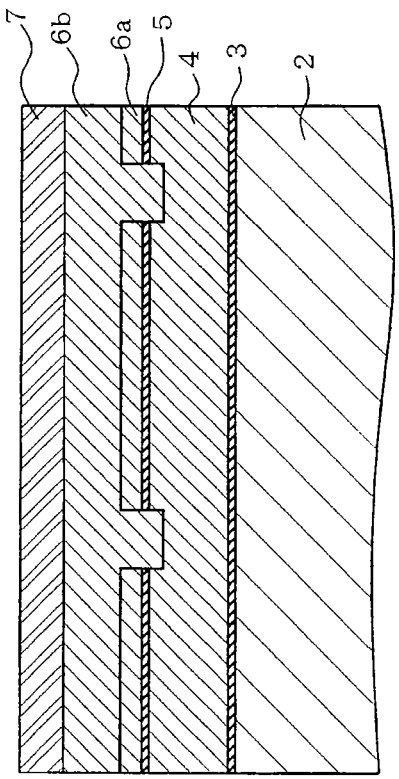
Figure 19C:
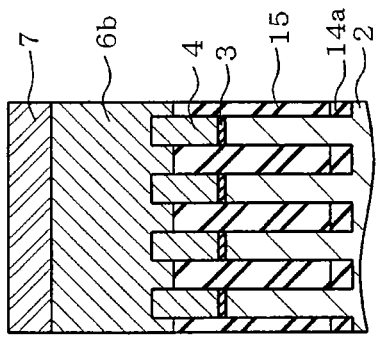
Figure 19D:
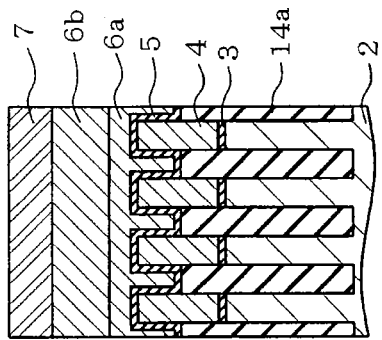
Figure 19E:
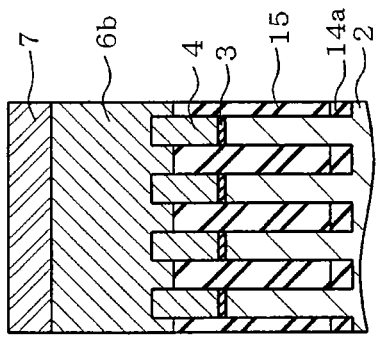

Referring to FIGS. 17A to 17E, the overfilled TEOS film 15 is etched back. As shown in FIG. 17B, the duration of the etching is controlled such that TEOS film 15 in the trench is substantially level with the upper surface of interelectrode insulating film 5.

Referring to FIGS. 18A to 18E, for example, polysilicon film 6b serving as the third gate electrode film is formed above polysilicon film 4 and polysilicon film 6a by LP-CVD.

Referring to FIGS. 19A to 19E, metal such as tungsten (W) is sputtered above polysilicon film 6b and thermally treated to obtain silicide layer 7.

Referring to FIGS. 20A to 20E, silicon nitride film 8 and TEOS film 9 serving as masks are deposited in the listed sequence by LP-CVD. Using lithography and anisotropic etching, TEOS film 9, silicon nitride film 8, silicide layer 7, polysilicon films 6a and 6b, interelectrode insulating film 5 and polysilicon film 4 are etched. First gate insulating film 3 may be etched at this phase of the manufacturing process flow.

Memory-cell gate electrodes MG collectively referred to as word line WL and select gate electrodes SG collectively referred to as select gate line SGL1 are formed by the foregoing manufacturing process flow. In the cross section illustrated in FIG. 20D, films 4, 5, 6a, 6b, 7, 8, and 9 are removed to expose the upper surface and upper sidewall of polysilazane 14a.

Referring to FIGS. 21A to 21E, hydrogen-fluoride based wet etchant is used to remove polysilazane 14a exposed by the gate structure formation to a predetermined depth. The wet etching of polysilazane 14a, serving as a sacrificial film, is controlled to a lower wet etching rate as compared to the wet etching rate of TEOS film 15. The region where polysilazane 14a is removed serves as air gap AG which occupies most of element isolation region Sb. As shown in FIG. 21C, the regions located below interelectrode insulating film 5 and located between element regions Sa where polysilazane 14a is removed constitutes air gap AG.

Referring to FIGS. 22A to 22E, silicon oxide film 10 is deposited by plasma CVD so as to cover the isolated memory-cell gate electrodes MG and select gate electrodes SG. Plasma CVD provides relatively poor step coverage and thus poor gap fill capability as compared to an ordinary CVD method.

Silicon oxide film 10 is deposited over across TEOS film 9 located above word lines WL and TEOS film 9 located above select gate lines SGL1. As a result, air gap AG is formed between memory-cell gate electrodes MG and between memory-cell gate electrodes MG and select gate electrodes SG.

Figure 22A:
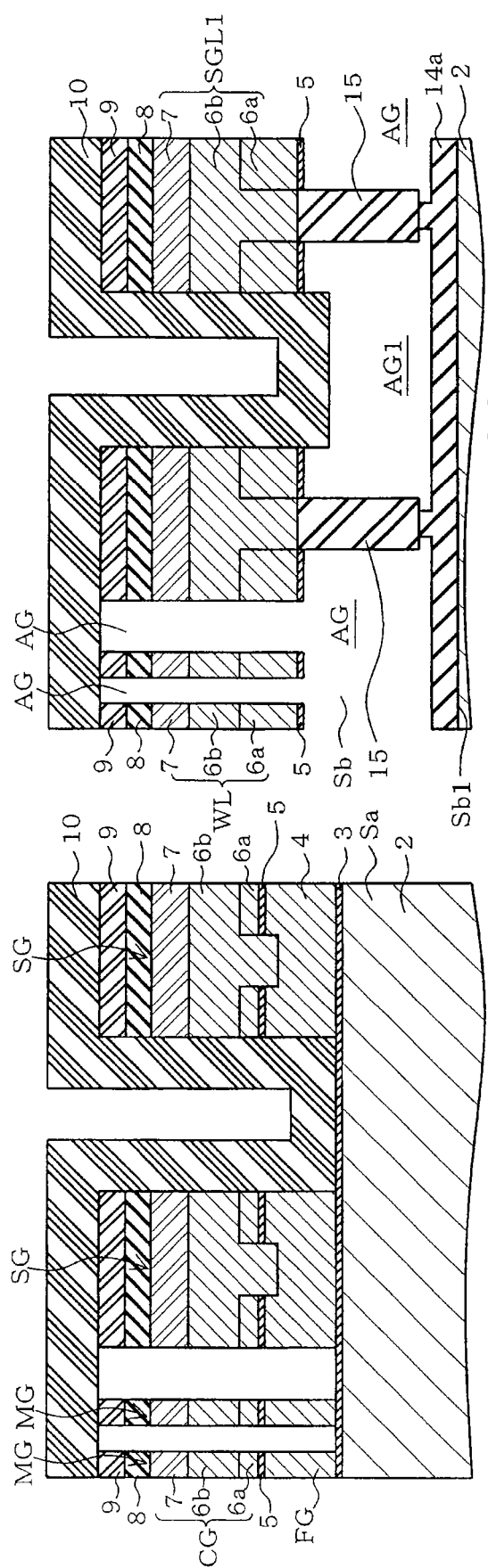
Figure 22B:
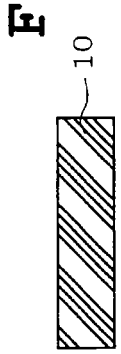
Figure 22C:
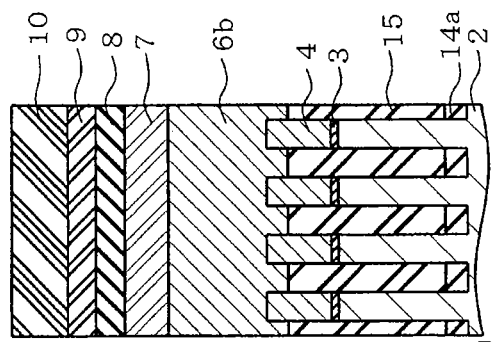
Figure 22D:
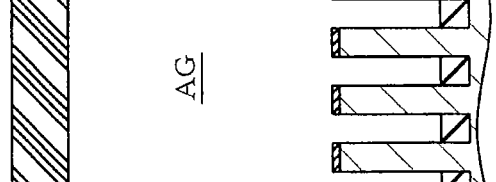
Figure 22E:
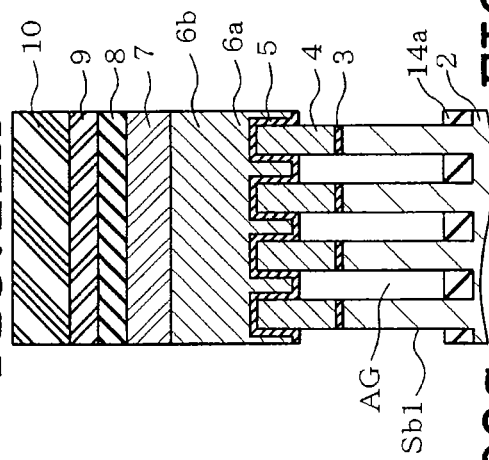

As shown in FIG. 22B, silicon oxide film 10 is formed so as to enclose gap AG1 of element isolation region Sb and across element regions Sa.

Referring to FIGS. 23A to 23E, a mask pattern not shown is formed for defining an opening in the region between select gate electrodes SGL1 by lithography. Using the mask pattern, silicon oxide film 10 located between select gate electrodes SGL1 is formed into a spacer by anisotropic etching.

Silicon oxide film 10 formed into a spacer is represented as silicon oxide film 11 in FIGS. 23A and 23B, 24A and 24B, and 25A and 25B.

Referring to FIGS. 24A to 24E, for example, silicon oxide film 12 is deposited by LP-CVD. As described earlier, TEOS film 15 is formed below select gate line SGL1 so as to serve as a boundary wall of air gap AG prior to the formation of silicon oxide film 12. Thus, the intrusion of gas used in forming silicon oxide film 12 into element isolation trench Sb1 located below word line WL can be suppressed. As a result, silicon oxide film 12 is formed in the portion in element isolation trench Sb1 located between TEOS film 15 below select gate lines SGL1, in other words, in gap AG1.

Above silicon oxide film 12, a silicon nitride film not shown serving as a CMP stopper is deposited by LP-CVD and as shown in FIGS. 25A to 25E, interlayer insulating film 13 comprising a BSPSG film is further deposited so as to reside in the inner side of the silicon nitride film.

Using the silicon nitride film as a stopper, planarization is carried out by CMP, whereafter additional interlayer insulating film not shown is further deposited above interlayer insulating film 13. A contact hole for forming bit line contact CB is formed through interlayer insulating film 13.

Multiple levels of interconnect structures are formed above bit line contact CB. The rest of the manufacturing process flow do not involve any features of the embodiments and thus will not be discussed. NAND flash memory 1 is obtained by the above described embodiments.

In the foregoing embodiments, polysilazane 14a is coated into the region for forming element isolation region Sb as a sacrificial film and polysilazane 14a is removed after depositing layers of films in order to provide air gap AG in element isolation region Sb. If only the above described process flow is considered, element isolation region Sb may become refilled by the intrusion of gases into the region where polysilazane 14a was removed in the subsequent formation of other functional films. Hence, it may not be possible to provide air gap AG in element isolation region Sb of the final structure.

Therefore, in the foregoing embodiments, TEOS film 15 is configured to enclose element isolation trench Sb1 located between first element region Sa1 below first gate electrode SG1 and second element region Sa2 below second gate electrode SG2 as shown in FIG. 2. Thus, air gap AG can be provided reliably in element isolation region Sb located between element region Sa1 below memory-cell gate electrode group MG1 and element region Sa2 below memory-cell gate electrode group MG2.

As a result, coupling capacitance between memory cell transistor group Trm1 of first element region Sa1 and memory cell transistor group Trm2 of second element region Sa1 can be suppressed while improving structural strength.

For instance, TEOS film 15 is configured to enclose element isolation regions Sb1 located below first element region Sa1 and second element regions Sa2 immediately below first gate electrode SG1 in each of blocks $B_k$ and $B_{k+1}$. Thus, even if silicon oxide film 10 is formed into a spacer later in the process flow to define an opening in silicon oxide film 10 located between select gate lines SGL1 to allow intrusion of gas used in the formation of silicon oxide film 12 below the surface of silicon substrate 2 through the opening, TEOS film 15 formed across element regions Sa1 and Sa2 blocks further intrusion of the gas. Thus, TEOS film 15 suppresses the intrusion of gases such as the ingredient gas for formation of silicon oxide film 12 into air gap AG located between element region Sa1 below memory-cell gate electrode group MG1 and element region Sa2 below memory-cell gate electrode group MG2. The above described configuration reliably prevents the refilling of air gap AG between element region Sa1 and element region Sa2.

Second Embodiment

FIG. 26A to FIG. 45E illustrate a second embodiment. The second embodiment described hereinafter includes the following differences from those described above.

Prior to the formation of the interelectrode insulating film, the upper sidewall as well as the upper surface of the first gate electrode film is exposed in the region for forming groups of memory-cell gate electrodes, and when forming the interelectrode insulating film, the topography of the region for forming the select gate electrode is configured such that the upper surface of the sacrificial film is substantially level or coplanar with the upper surface of the first gate electrode film.

The polysilazane used as a material for forming the sacrificial film is transformed while being exposed to the ambient so that at least a portion of the boundary wall of the air gap is made of an oxide film. Elements that are identical or similar across the embodiments are identified by identical reference symbols and are not redescribed. The following description will be based on the differences from the foregoing embodiments.

Figure 27:
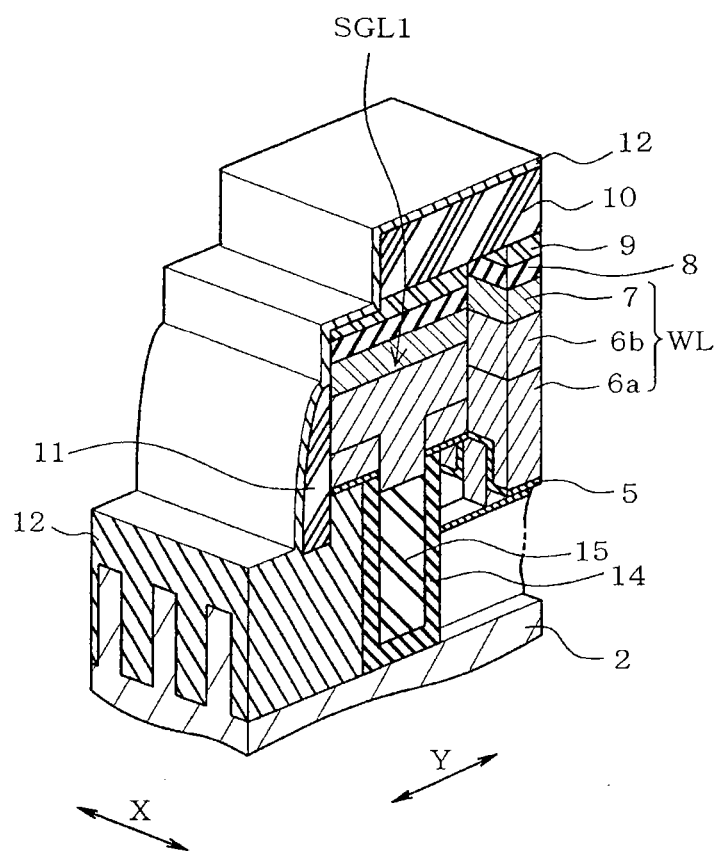
FIG. 27 pertains to the second embodiment and is one schematic example of a perspective view corresponding to FIG. 4B.

FIGS. 26A to 26E are schematic examples of cross sectional structures of the second embodiment and corresponds to FIGS. 3A to 3E. FIG. 27 is one example of a perspective view corresponding to FIG. 4B.

Referring to FIG. 26B, silicon oxide film 14 and TEOS oxide film 15 are configured as an air gap wall in element isolation trench Sb1 located below select gate line SGL1. The air gap wall is also referred to as a boundary wall, an insulation wall, or simply as a wall serving as a boundary of the air gap. Silicon oxide film 14 is formed based on polysilazane 14a which is hardened by thermal treatment, etc. Silicon oxide film 14 covers the sidewall and the underside of TEOS film 15.

Still referring to FIG. 26B, the elevation of interelectrode insulating film 5 in the region for forming select gate line SGL1 is higher as compared to the elevation of interelectrode insulating film 5 in the region for forming word line WL. In the region for forming select gate line SGL1, silicon oxide film 14 is formed below interelectrode insulating film 5 and TEOS film 15 is filled in the inner side of silicon oxide film 14. Further, polysilicon film 6b is filled in the inner upper portion of silicon oxide film 14 so as to be located above the upper surface of TEOS film 15.

Description is given hereinafter on the manufacturing process flow of the above described structure with reference to FIGS. 28A to 45E. The process flow up to controlling the upper surfaces of polysilicon film 4 and polysilazane 14a to be substantially level, which is illustrated for example in FIG. 9, is identical to the earlier described embodiments and thus, will not be redescribed.

After the upper surfaces of polysilicon film 4 and polysilazane 14a are controlled to be substantially level, resist 20 is coated as shown in FIGS. 28A to 28E and thereafter, exposed and developed into a predetermined pattern. Referring to FIG. 29, region R2 of patterned resist 20 includes regions for forming a couple of drain-side select gate lines SGL1 each belonging to adjacent block $B_k$ and block $B_{k+1}$ but does not include the region for forming word lines WL.

Figure 28B:
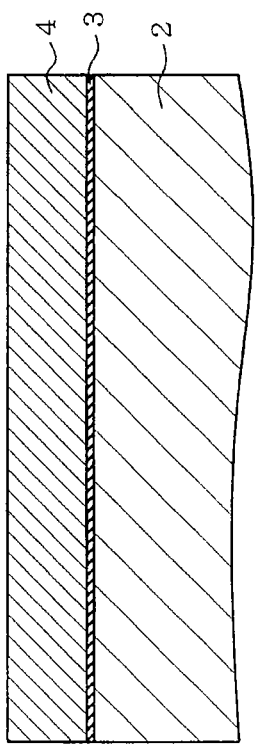
Figure 28A:
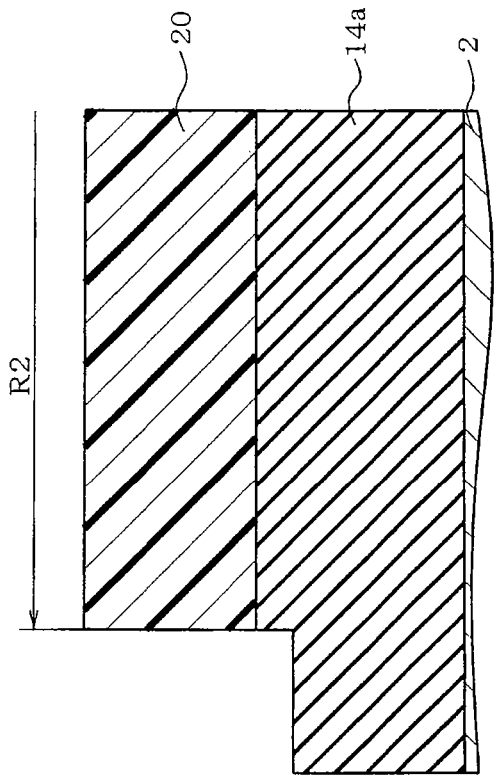
Figure 28E:
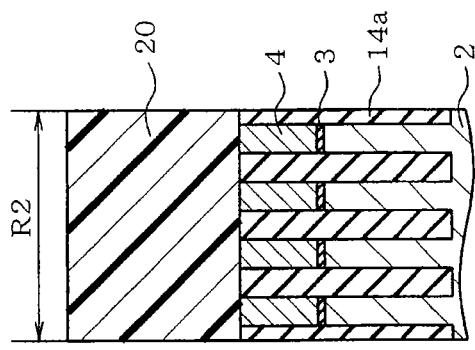
Figure 28D:
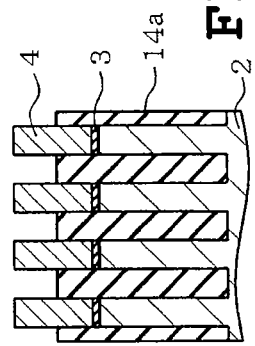
Figure 28C:
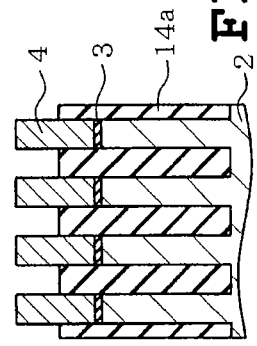
Figure 29:
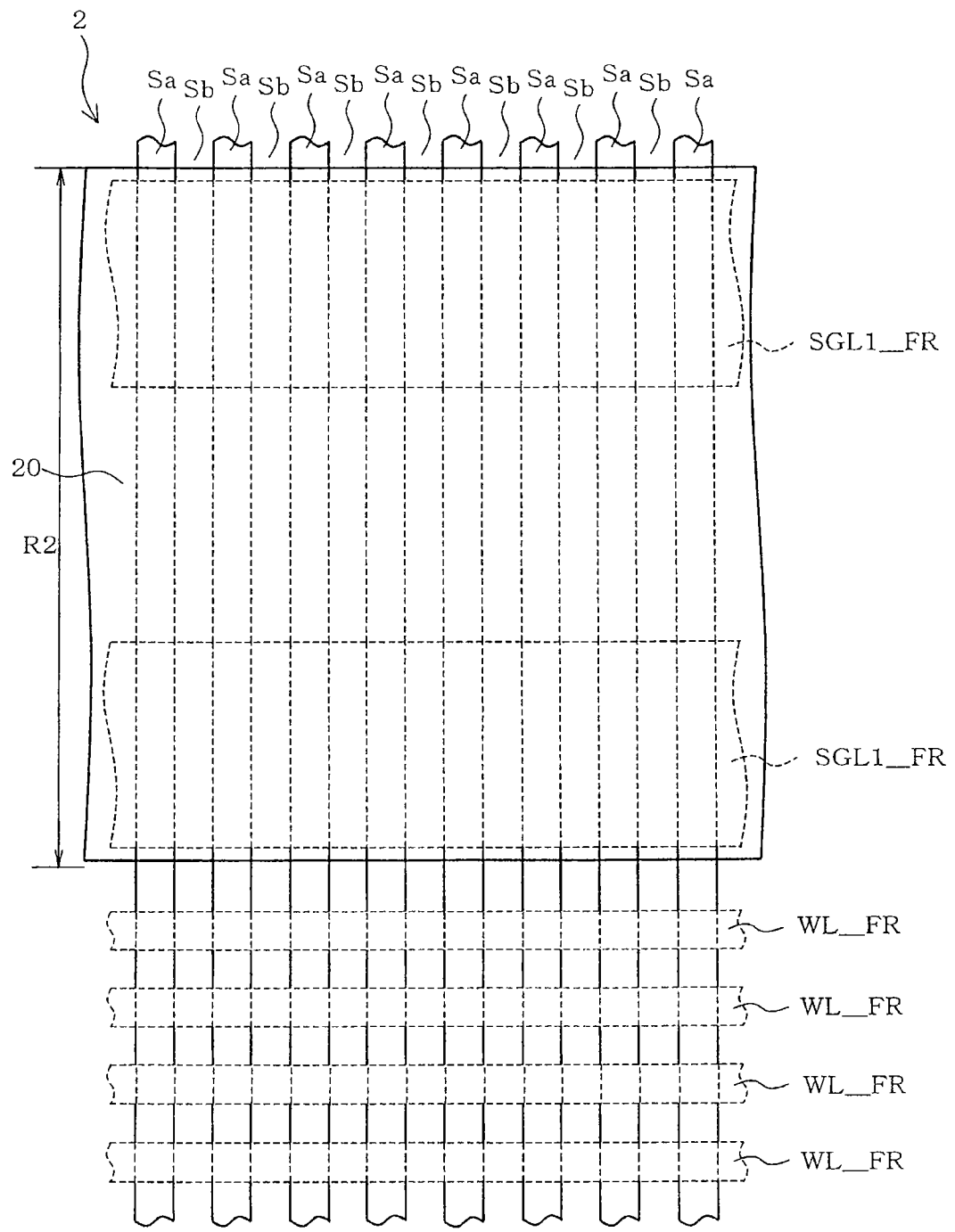

Referring to FIGS. 28A to 28E, using the patterned resist 20 as a mask, polysilazane 14a is etched back such that in the regions exclusive of region R2, the upper surface of polysilazane 14a is located between the upper surface of polysilicon film 4 and the upper surface of gate insulating film 3. Because the upper surfaces of polysilazane 14a and polysilicon film 4 are masked in region R2, they remain substantially planar as shown in FIG. 28E. The patterned resist 20 is thereafter removed.

Figure 30B:
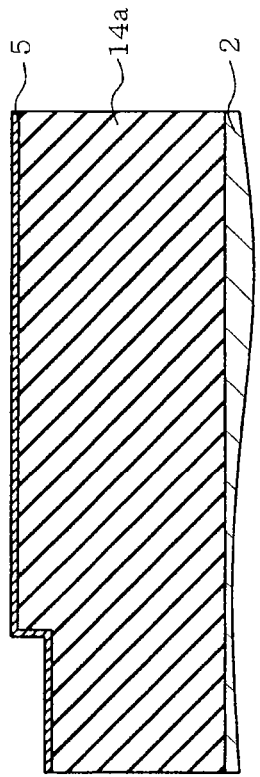
Figure 30A:
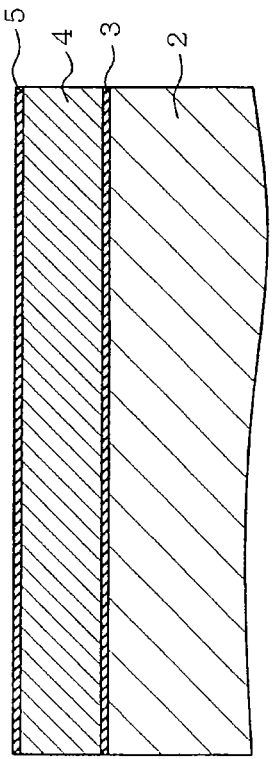
Figure 30E:
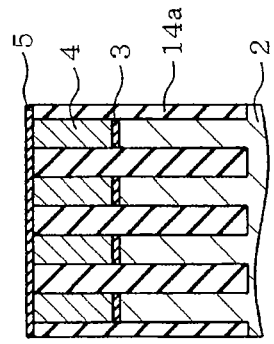
Figure 30D:
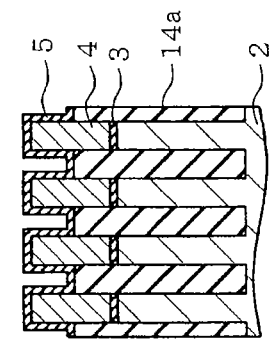
Figure 30C:
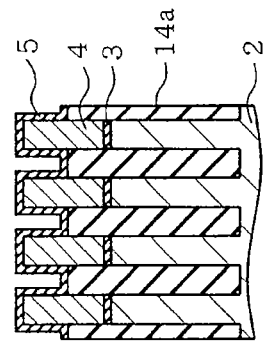
Figure 31B:
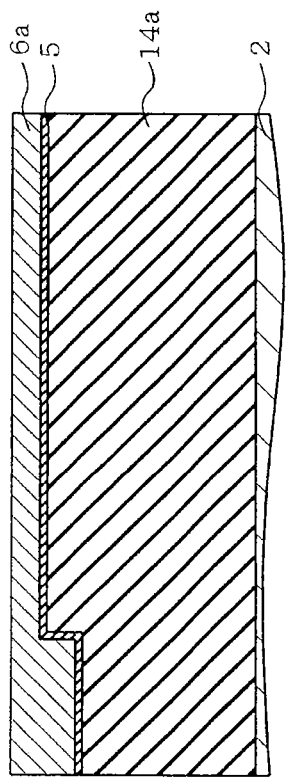
Figure 31A:
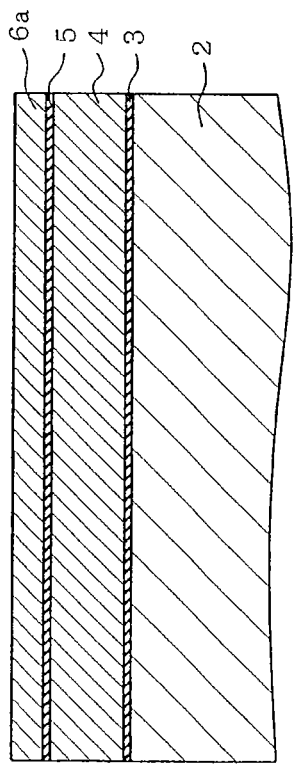
Figure 31C:
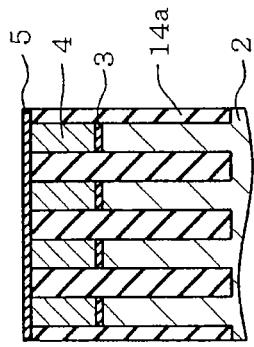
Figure 31D:
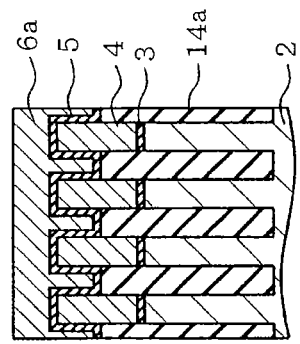
Figure 31E:
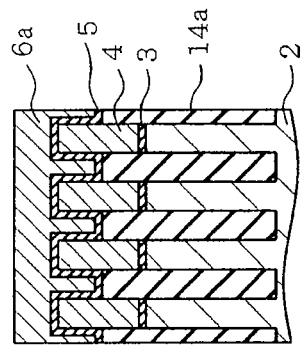
Figure 33:
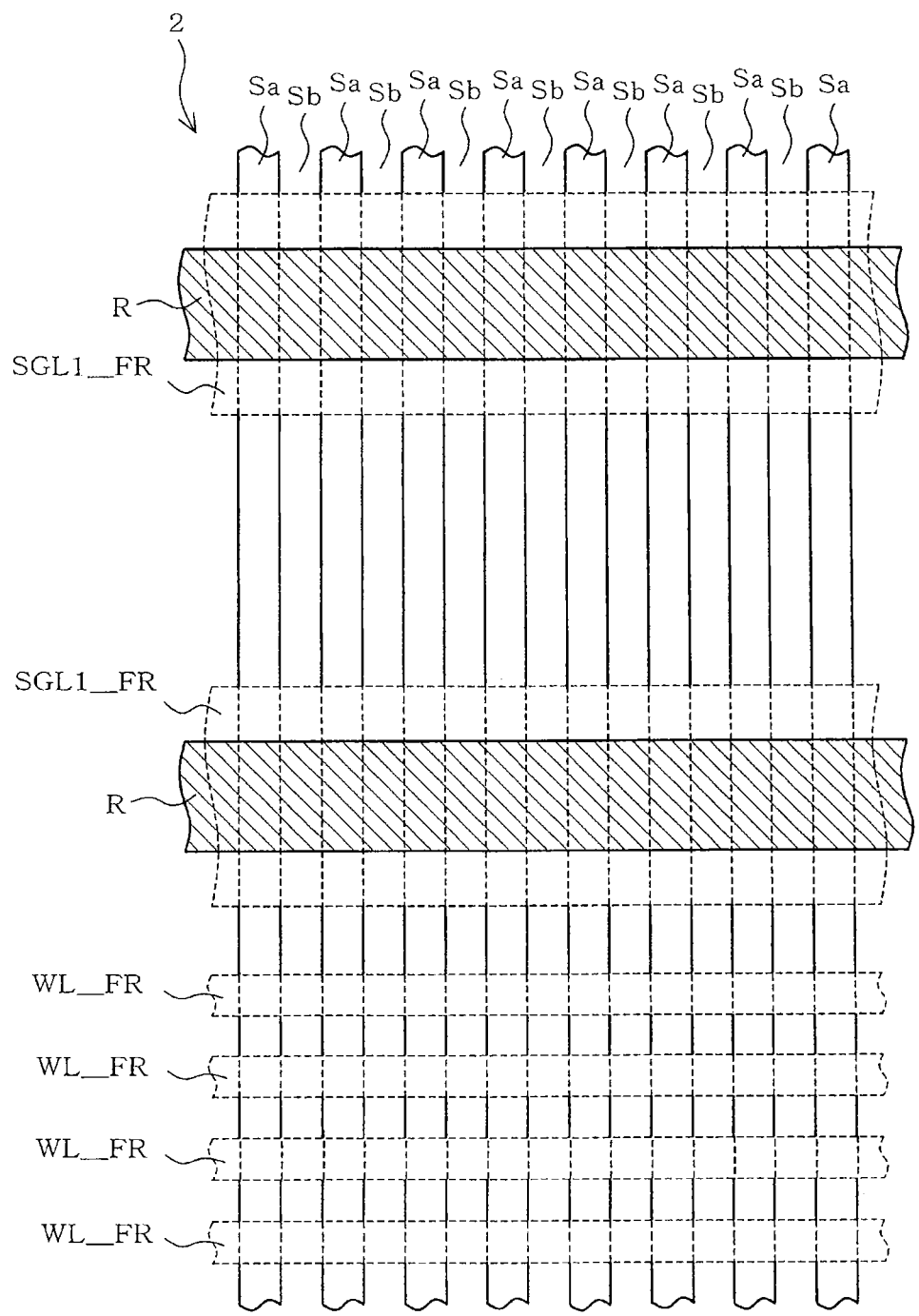
Figure 34A:
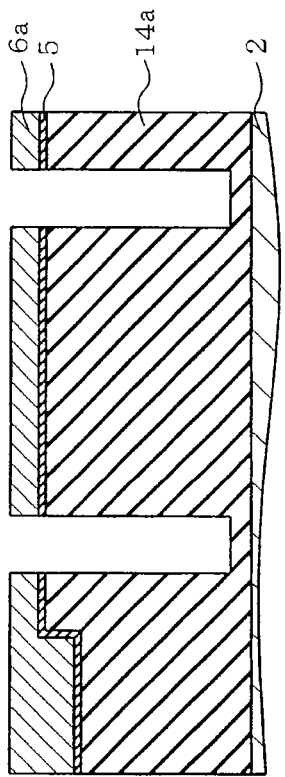
Figure 34B:
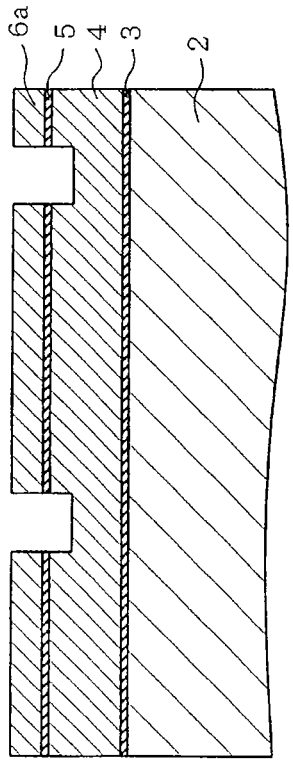
Figure 34C:
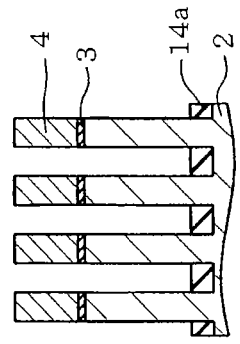
Figure 34D:
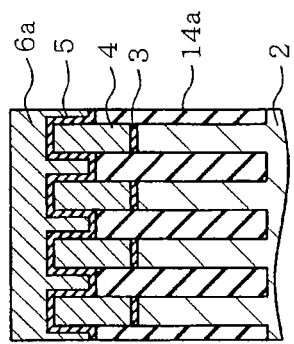
Figure 34E:
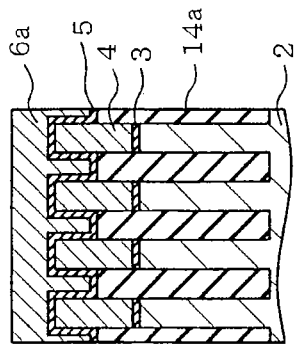

Referring to FIGS. 30A to 30E, interelectrode insulating film 5 is blanketed. As described earlier, the upper surface of polysilazane is substantially level with the upper surface of polysilicon film 4 in region R2 as shown in FIG. 30E. Thus, in the region shown in FIG. 30E, interelectrode insulating film 5 is formed above the planer upper surfaces of polysilicon film 4 and polysilazane 14a.

Referring to FIGS. 31A to 31E, polysilicon film 6a is deposited above interelectrode insulating film 5.

Referring to FIGS. 32A to 32E and 33, polysilicon film 6a is isolated. Region R of polysilicon film 6a resides in region SGL1_FR where select gate line SGL1 is to be formed and thus, serves as a region for establishing contact between polysilicon film 4 and polysilicon film 6b as was the case of region R of the earlier described embodiments. As shown in FIGS. 32A and 32B, polysilicon film 6a deposited above interelectrode insulating film 5 is removed to define an opening without etching interelectrode insulating film 5 serving as an etch stop.

Referring to FIGS. 34A to 34E, interelectrode insulating film 5 and polysilazane 14a is etched back to deepen the opening into a trench. The etch back may be achieved through RIE and wet etching using buffered hydrogen fluoride solution as a wet etchant. In an alternative embodiment, the wet etching may be omitted. Then, an inner surface of the polysilazane 14a is exposed by the trench.

Figure 35A:
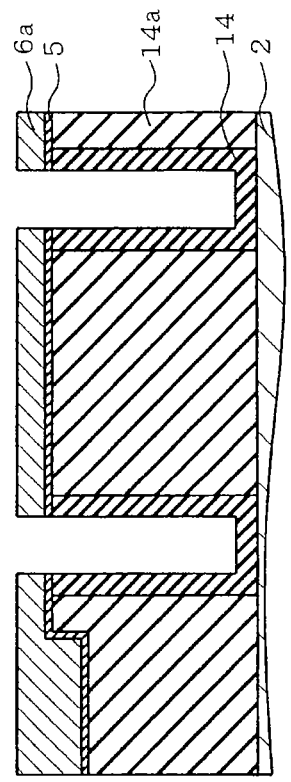
Figure 35B:
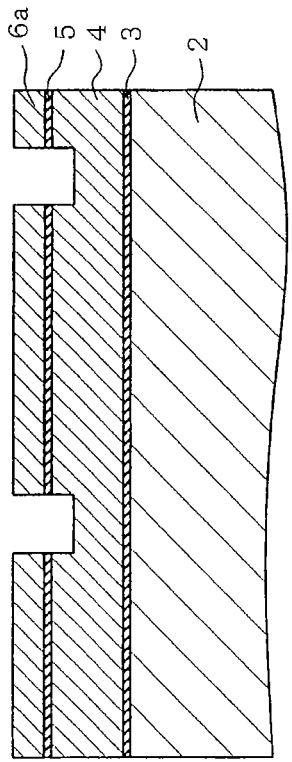
Figure 35C:
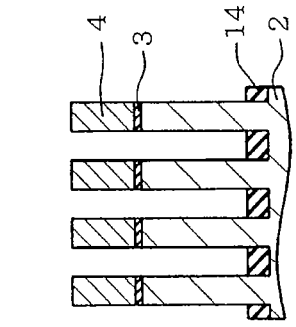
Figure 35D:
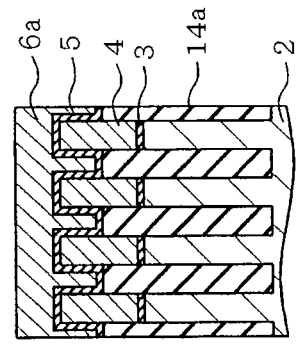
Figure 35E:
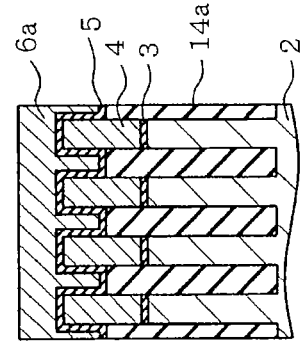

Referring to FIGS. 35A to 35E, polysilazane 14a is transformed into silicon oxide film 14 from the inner surface of the polysilazane 14a by warm water. In one embodiment, polysilazane 14a may be thermally treated in a high-temperature vapor atmosphere of approximately 550 degrees Celsius for transformation into silicon oxide film 14 which may also be referred to as a transformed oxide film. In an alternative embodiment, nitrogen (N) may be introduced for increasing structural strength. As shown in FIG. 35B, polysilazane 14a may be transformed into silicon oxide film 14 in the extent running from the underside of interelectrode insulating film 5 to the upper surface of semiconductor substrate 2. Thus, silicon oxide film 14 exhibits a substantially U-shape structure. Silicon oxide film 14 is thus, formed at the boundary of the air gap defined later in the process flow.

Referring to FIGS. 36A to 36E, TEOS film 15 serving as a liner film is overfilled into the trenches outlined by silicon oxide film 14.

Figure 37B:
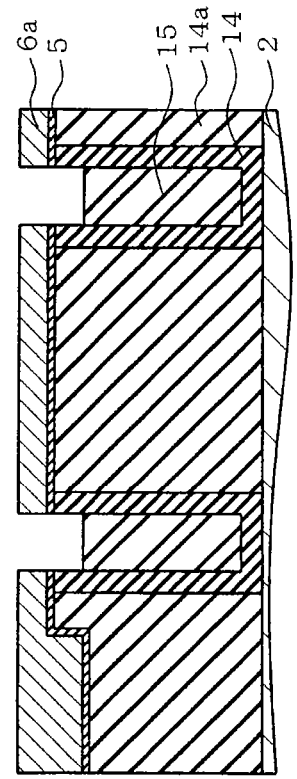
Figure 37A:
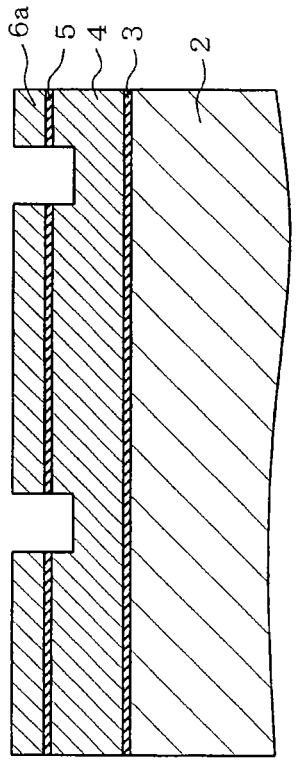
Figure 37E:
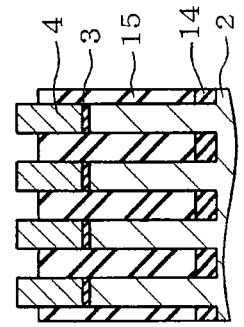
Figure 37D:
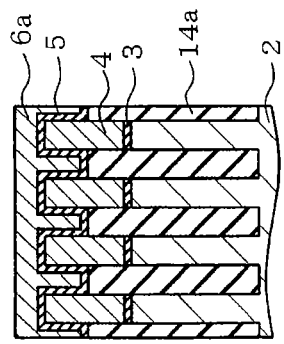
Figure 37C:
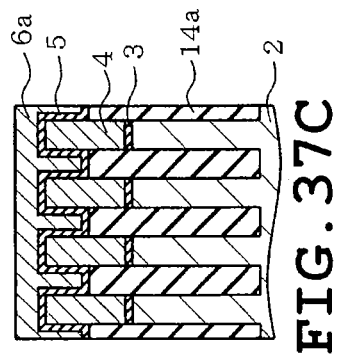
Figure 38A:
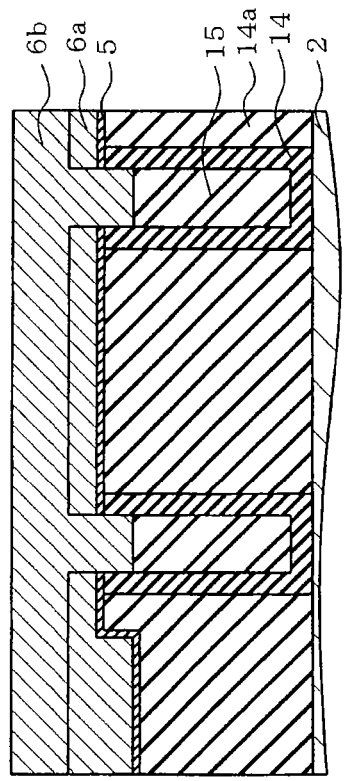
Figure 38B:
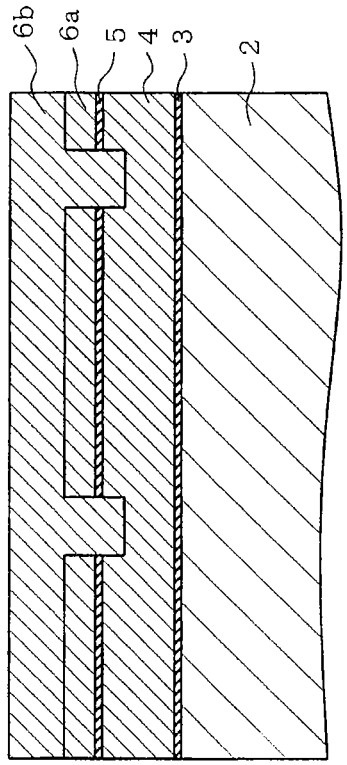
Figure 38C:
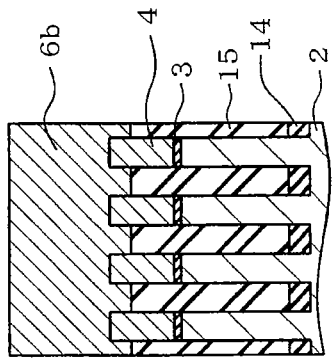
Figure 38D:
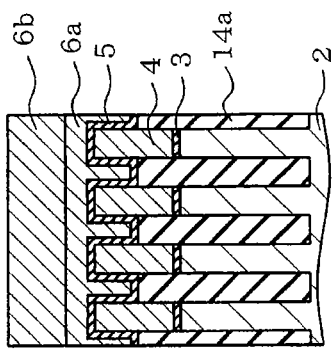
Figure 38E:
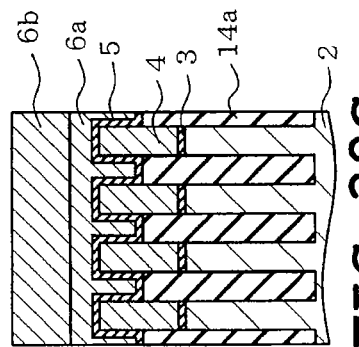
Figures 43A, 43B, 43C, 43D, 43E:
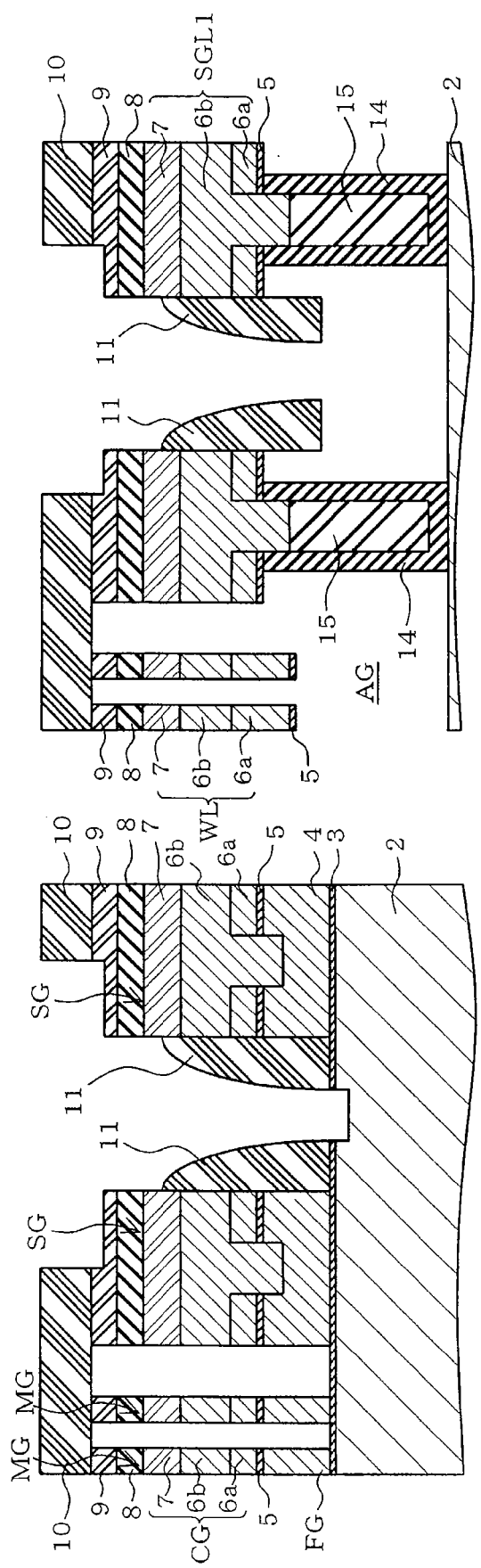

Referring to FIGS. 37A to 37E, the overfilled TEOS film 15 is etched back. As shown in FIG. 37B, the duration of the etching is controlled such that the upper surface of TEOS film 15 remaining in the trench is substantially level with the upper surface of interelectrode insulating film 5 or lower so as to reside at a predetermined elevation.

Referring to FIGS. 38A to 38E, polysilicon film 6b serving as the third gate electrode film is formed above polysilicon film 6a by LP-CVD.

Referring to FIGS. 39A to 39E, metal such as tungsten (W) is sputtered above polysilicon film 6b and thermally treated to obtain silicide layer 7.

Referring to FIGS. 40A to 40E, silicon nitride film 8 and TEOS film 9 serving as masks are deposited in the listed sequence by LP-CVD. Using lithography and anisotropic etching, TEOS film 9, silicon nitride film 8, silicide layer 7, polysilicon films 6a and 6b, interelectrode insulating film 5, and polysilicon film 4 are etched and thus, isolated. First gate insulating film 3 may be isolated at this phase of the manufacturing process flow as was the case in the earlier described embodiments. Memory-cell gate electrodes MG and select gate electrodes SG are formed by the foregoing manufacturing process flow.

As the result of isolation of films 4, 5, 6a, 6b, and 7 to 9, the upper surface and the upper sidewall of polysilazane 14a is exposed in the region between each of word lines WL shown in FIG. 40D. Further, because the isolation of the foregoing films is carried out with relatively higher selectivity to a silicon oxide film, the upper surface of polysilazane 14a is only slightly etched as shown in FIG. 40B.

The rest of the manufacturing process flow are the same as those of the earlier described embodiments but will be briefly redescribed. Referring to FIGS. 41A to 41E, hydrogen-fluoride (HF) based wet etchant is used to remove polysilazane 14a. Referring to FIGS. 42A to 42E, approximately 100 nm of silicon oxide film 10 is deposited by plasma CVD, providing relatively poor step coverage and thus poor gap fill capability as compared to an ordinary CVD method, so as to cover the isolated memory-cell gate electrodes MG and select gate electrodes SG. Referring to FIGS. 43A to 43E, silicon oxide film 10 located between select gate electrodes SGL1 is formed into a spacer-like shape by anisotropic etching. As was the case in the earlier described embodiments, silicon oxide film 10 formed into a spacer-like shape is represented as silicon oxide film 11.

Referring to FIGS. 44A to 44E, approximately 10 nm of silicon oxide film 12 is deposited by LP-CVD. As described earlier, TEOS film 15 is formed below select gate line SGL1 so as to serve as a boundary wall of air gap AG prior to the formation of silicon oxide film 12. Thus, the intrusion of gas used in forming silicon oxide film 12 into element isolation trench Sb1 located below memory-cell gate electrode MG and between element regions Sa can be suppressed.

Above silicon oxide film 12, a silicon nitride film not shown serving as a CMP stopper is deposited by LP-CVD and as shown in FIGS. 45A to 45E, interlayer insulating film 13 comprising a BPSG (Borophosphosilicate glass) film is further deposited so as to reside between select gate electrodes SG in the inner side of the silicon nitride film.

Using the silicon nitride film as a stopper, interlayer insulating film 13 is planarized by CMP, whereafter additional interlayer insulating film not shown comprising a TEOS film is further deposited above interlayer insulating film 13.

Referring to FIGS. 26A to 26E, a contact hole for forming bit line contact CB is formed through interlayer insulating film 13. NAND flash memory 1 is obtained by the above described embodiments.

In the above described embodiment, interelectrode insulating film 5 is formed under a condition in which the upper surfaces of the underlying polysilazane 14a and polysilicon film 4 are substantially level. Thus, removal of interelectrode insulating film 5 is facilitated as compared to removing the same from a curved or stepped surface.

The exposed interior of polysilazane 14a through trench formation is transformed into silicon oxide film 14 so as to at least partially constitute an air gap boundary wall comprising an oxide film.

The foregoing embodiments may be modified as follows.

Figure 15E:
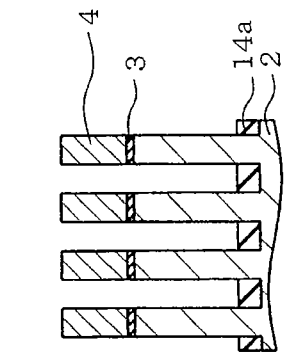
Figure 16A:
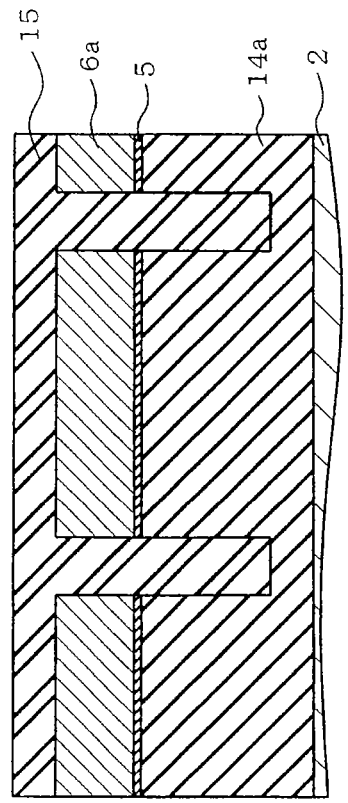
Figure 16B:
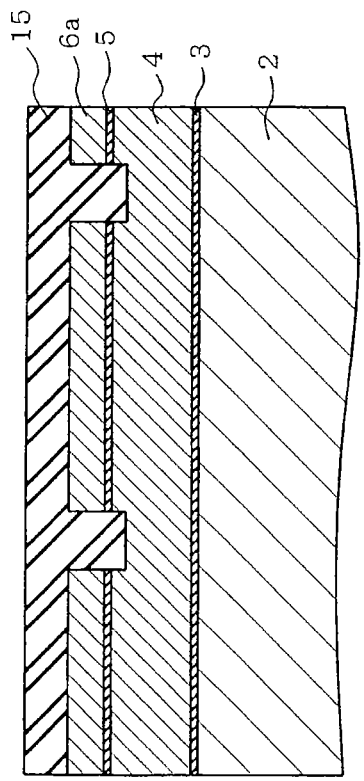
Figure 16C:
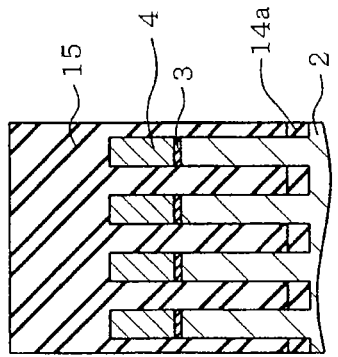
Figure 16D:
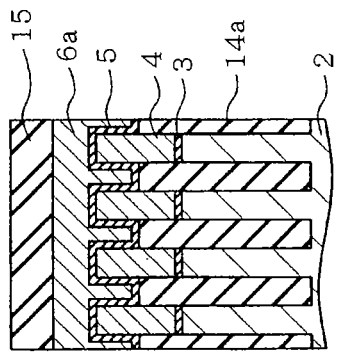
Figure 16E:
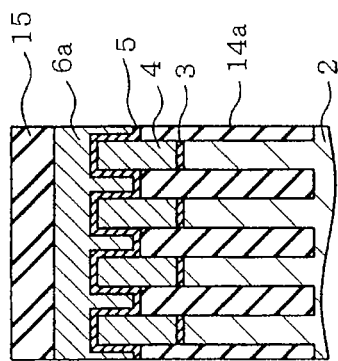

Silicon oxide film 14 which was only partially removed so as to remain in the region shown in FIG. 15E may be fully removed.

Polysilicon films 4, 6a, and 6b serving as the first, second, and third gate electrode film respectively, may be replaced by amorphous silicon film. The amorphous silicon film, however, may eventually be transformed into a polysilicon film as it goes through the manufacturing process flow.

Silicide layer 7 being formed on the upper portions of select gate electrodes SG and memory-cell gate electrodes MG by siliciding tungsten (W) may be formed by other metal materials. The timing of silicidation may be varied depending upon the metal material being used.

TEOS film 15 being formed immediately below select gate electrode SG may be replaced by other types of oxide films or nitride films.

Polysilazane 14a being employed as a sacrificial film may be replaced by other types of materials as long as the replacement film can be etched with selectivity to the insulating film, one example of which is TEOS film, formed immediately below select gate electrode SG.

A dummy transistor may be provided between select gate transistor Trs1/Trs2 and memory cell transistor Trm.

Foregoing embodiments were described through NAND flash memory application. Embodiments applied to other types of nonvolatile semiconductor storage device such as NOR flash memory and EEPROM also fall within the scope of the application.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
   a semiconductor substrate,
   an element isolation region comprising a plurality of element isolation trenches formed into the semiconductor substrate so as to extend in a first direction taken along a surface of the semiconductor substrate;
   a plurality of first element regions and a plurality of second element regions, both disposed adjacent to at least one element isolation trench of the plurality of element isolation trenches in a second direction taken along the surface of the semiconductor substrate, each of the plurality of first element regions and plurality of second element regions extending in the first direction and being isolated from each other by a corresponding one of the plurality of element isolation trenches in the second direction, the second direction intersecting with the first direction;
   a first select gate electrode formed above a first gate insulating film formed in the plurality of first element regions;
   a first group of memory-cell gate electrodes formed above the first gate insulating film and being disposed above a single first element region of the plurality of first element regions, the first group of memory-cell gate electrodes being aligned along the first direction with the first select gate electrode;
   a second select gate electrode formed above a second gate insulating film formed in the plurality of second element regions;
   a second group of memory-cell gate electrodes formed above the second gate insulating film and being disposed above a single second element region of the plurality of second element regions, the second group of memory-cell gate electrodes being aligned along the first direction with the second select gate electrode and parallel to the first group of memory-cell gate electrodes;
   an unfilled gap formed in each of the plurality of element isolation trenches located adjacent to at least one first element region of the plurality of first element regions immediately below the first group of memory-cell gate electrodes, and located adjacent to at least one second element region of the plurality of second element regions immediately below the second group of memory-cell gate electrodes; and
   an insulation wall enclosing the unfilled gap formed in each of the plurality of element isolation trenches located adjacent to said at least one first element region immediately below the first select gate electrode, and located adjacent to said at least one second element region immediately below the second select gate electrode.

2. The device according to claim 1, wherein the insulation wall includes a first insulating film lined along a bottom of each of the plurality of element isolation trenches, and a second insulating film formed above the first insulating film.

3. The device according to claim 2, wherein the first insulating film comprises a silicon oxide film and the second insulating film comprises a tetraethyl orthosilicate film.

4. The device according to claim 3, wherein the silicon oxide film comprises a polysilazane being at least partially hardened.

5. The device according to claim 1, wherein the first group of memory-cell electrodes and the second group of memory-cell gate electrodes, and the first select gate electrode and the second select gate electrode, constitute a NAND flash memory device.

6. A semiconductor storage device, comprising:
   a semiconductor substrate,
   an element isolation region comprising a plurality of element isolation trenches formed into the semiconductor substrate so as to extend in a first direction taken along a surface of the semiconductor substrate;
   a plurality of first element regions and a plurality of second element regions, both disposed adjacent to at least one element isolation trench of the plurality of element isolation trenches in a second direction taken along the surface of the semiconductor substrate, each of the plurality of first element regions and plurality of second element regions extending in the first direction and being isolated from each other by a corresponding one of the plurality of element isolation trenches in the second direction, the second direction intersecting with the first direction;
   a first select gate electrode formed above a first gate insulating film formed in the plurality of first element regions, the first select gate electrode including a stack of a first conductive film, an interelectrode insulating film, and a second conductive film, in which the first conductive film and the second conductive film establish a physical contact with each other through a trench formed through the interelectrode insulating film and separate from the plurality of element isolation trenches in both the first direction and the second direction;
   a first group of memory-cell gate electrodes formed above the first gate insulating film and being disposed above a single first element region of the plurality of first element regions, the first group of memory-cell gate electrodes being aligned along the first direction with the first select gate electrode;
   a second select gate electrode formed above a second gate insulating film formed in the plurality of second element regions, the second select gate electrode including a stack of a third conductive film, the interelectrode insulating film extending from the first select gate electrode, and the second conductive film extending from the first gate electrode, in which the third conductive film and the second conductive film establish a physical contact with each other through said trench that is formed through the interelectrode insulating film and separate from the plurality of element isolation trenches in both the first direction and the second direction;
   a second group of memory-cell gate electrodes formed above the second gate insulating film and being disposed above a single second element region of the plurality of second element regions, the second group of memory-cell gate electrodes being aligned along the first direction with the second select gate electrode and parallel to the first group of memory-cell gate electrodes;

an unfilled gap formed in each of the plurality of element isolation trenches located adjacent to at least one first element region of the plurality of first element regions immediately below the first group of memory-cell gate electrodes, and located adjacent to at least one second element region of the plurality of second element regions immediately below the second group of memory-cell gate electrodes; and an insulation wall enclosing the element isolation trench located immediately below said trench that is formed through the interelectrode insulating film and separate from the plurality of element isolation trenches in both the first direction and the second direction, the insulation wall being formed between the at least one first element region and the at least one second element region, the insulation wall serving as a boundary wall of the unfilled gap.

7. The device according to claim 2, wherein the trench that is formed through the interelectrode insulating film and separate from the plurality of element isolation trenches in both the first direction and the second direction is disposed at a mid portion of the interelectrode insulating film taken along the first direction.

* * * * *